(12) United States Patent
Blackwell et al.

(10) Patent No.: US 6,518,516 B2
(45) Date of Patent: Feb. 11, 2003

(54) MULTILAYERED LAMINATE

(75) Inventors: Kim J. Blackwell, Owego, NY (US); Frank D. Egitto, Binghamton, NY (US); Voya R. Markovich, Endwell, NY (US); Manh-Quan T. Nguyen, Endicott, NY (US); Douglas O. Powell, Endicott, NY (US); David L. Thomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/121,821

(22) Filed: Apr. 11, 2002

(65) Prior Publication Data

US 2002/0108780 A1 Aug. 15, 2002

Related U.S. Application Data

(63) Continuation-in-part of application No. 09/557,802, filed on Apr. 25, 2000, now Pat. No. 6,407,341.

(51) Int. Cl.⁷ ................................................ H01K 9/09
(52) U.S. Cl. ...................... 174/262; 174/255; 29/852
(58) Field of Search ................. 174/255, 262; 29/846, 852; 361/780

(56) References Cited

U.S. PATENT DOCUMENTS

| | | | |
|---|---|---|---|
| 5,185,502 A | 2/1993 | Shepherd et al. | |
| 5,298,685 A | 3/1994 | Bindra et al. | |
| 5,316,787 A | 5/1994 | Frankeny et al. | |
| 5,362,534 A | 11/1994 | McKenney et al. | |
| 5,435,057 A | 7/1995 | Bindra et al. | |
| 5,557,843 A | 9/1996 | McKenney et al. | |
| 5,558,928 A | 9/1996 | DiStefano et al. | |
| 5,745,333 A | 4/1998 | Frankeny et al. | |
| 5,747,222 A | 5/1998 | Ryu | |
| 5,822,856 A | 10/1998 | Bhatt et al. | |
| 5,834,160 A | 11/1998 | Ferry et al. | |
| 6,103,135 A | 8/2000 | Kusner et al. | |
| 6,131,279 A | 10/2000 | Jones et al. | |
| 6,181,004 B1 * | 1/2001 | Koontz et al. | 257/691 |
| 6,255,039 B1 | 7/2001 | Xu et al. | |

* cited by examiner

Primary Examiner—Albert W. Paladini
(74) Attorney, Agent, or Firm—Schmeiser, Olsen & Watts; Lawrence R. Fraley

(57) ABSTRACT

A multilayered laminate, substructures and associated methods of fabrication are presented. The multilayered laminate includes in sequential order: (a) a first intermediate layer having microvias and conductive lands; (b) a plurality of signal/power plane substructures, wherein a dielectric material of an intervening dielectric layer insulatively separates each pair of successive signal/power plane substructures and (c) a second intermediate layer having microvias and conductive lands.

17 Claims, 14 Drawing Sheets

MULTILAYERED LAMINATE

This is a continuation-in-part of application Ser. No. 09/557,802 filed on Apr. 25, 2000, now U.S. Pat. No. 6,407,341.

BACKGROUND OF THE INVENTION

1. Technical Field

The present invention relates to conductive substructures of a multilayered laminate and associated methods of fabrication.

2. Related Art

FIGS. 1, 2, and 3 illustrate conductive substructures that may appear in a conventional multilayered laminate. FIG. 1 illustrates a 0S2P substructure 10, FIG. 2 illustrates a 2S0P substructure 20, and FIG. 3 illustrates a 1S1P substructure 30. Definitionally, the substructures in this application are described by an adjective of the form nSmP, wherein n and m are non-negative integers, wherein S stands for "signal plane," and wherein P stands for "power plane." Thus, "0S2P" connotes 0 signal planes and 2 power planes (n=0, m=2), "2S0P" connotes 2 signal planes and 0 power planes (n=2, m=0), and "1S1P" connotes 1 signal plane and 1 power plane (n=1, m=1). A conventional multilayered laminate comprises stacked substructures which may include any or all of the 0S2P, 2S0P, and 1S1P substructures.

A power plane is characterized by its inclusion of a continuously conductive layer. For example, the 0S2P substructure 10 in FIG. 1 comprises a power plane 11 which includes a continuously conductive layer 12, and a power plane 13 which includes a continuously conductive layer 14. As another example, the 1S1P substructure 30 in FIG. 3 comprises a power plane 31 which includes a continuously conductive layer 32. Although not shown in FIGS. 1 and 3, a power plane may include one or more holes within the continuous conductive layer. The continuous conductive layer of a power plane may include copper.

A signal plane is characterized by its inclusion of a layer comprising conductive circuitry. For example, the 2S0P substructure 20 in FIG. 2 comprises a signal plane 21 which includes a conductive circuitry 22, and a signal plane 23 which includes a conductive circuitry 24. As another example, the 1S1P substructure 30 in FIG. 3 comprises a signal plane 33 which includes a conductive circuitry 34. The conductive circuitry of a signal plane may include copper.

A substructure may include a via through its thickness, such as a conductively plated via 27 in the 2S0P substructure 20 in FIG. 2.

In a substructure, a power plane cannot conductively contact another power plane, a power plane cannot conductively contact a signal plane, and a signal plane cannot conductively contact another signal plane. Thus, power planes and signal planes may be insulatively separated by a dielectric layer. As a first example, the 0S2P substructure 10 in FIG. 1 comprises a dielectric layer 15 that insulatively separates the power plane 11 from the power plane 13. As a second example, the 2S0P substructure 20 in FIG. 2 comprises a dielectric layer 25 that insulatively separates the signal plane 21 from the signal plane 23. As a third example, the 1S1P substructure 30 in FIG. 3 comprises a dielectric layer 35 that insulatively separates the power plane 31 from the signal plane 33.

Unfortunately, some or all of the preceding 0S2P, 2S0P, and 1S1P substructures prevent improved wiring density within the substructures, and thus within the overall multilayered laminate that includes the 0S2P, 2S0P, and 1S1P substructures. With the 2S0P substructure of FIG. 2, for example, the conductive circuitry 22 may be required to be oriented at about right angles to the conductive circuitry 24 in order to minimize cross-talk (i.e., noise) due to electromagnetic radiative coupling between the conductive circuitry 22 and the conductive circuitry 24; i.e., if x and y axes represent orthogonal directions within the signal planes 21 and 23, then the conductive circuitry 22 would be oriented in the x direction if the conductive circuitry 24 were oriented in the y direction, and vice versa. The aforementi ned directional constraints on the conductive circuitry 22 and the conductive circuitry 24 translates into a constraint on wireability (i.e., a constraint on how high the wiring density can be within the signal planes 21 and 23).

Additionally, with less than optimum wiring density, the geometrical size of the overall multilayered laminate will have to be large enough to accommodate all of the wiring that is physically required for the intended application. The increased size is undesirable, because of at least two reasons. A first reason is that space is likely to be at a premium and a conservation of space is generally strived for in the electronic packaging industry. A second reason is that an increased size is more expensive because of increased material requirements and, more importantly, a requirement to drill longer through holes through the substructures and the overall multilayered laminate.

Moreover, if a highly pliable or flexible dielectric material is used in the substructures, then all three of the 0S2P, 2S0P, and 1S1P substructures will be required to have a thickness that is large enough for the substructures to have sufficient structural rigidity. Note that an organic dielectric material for use in a chip carrier may exemplify a highly pliable or flexible dielectric.

There is a need for conductive substructures for use in multilayered laminates such as chip carriers, wherein the conductive substructures improve wireability, reduce substructure and overall laminate thicknesses, and result in lower fabrication costs.

SUMMARY OF THE INVENTION

A second aspect of the present invention is a method for forming a multilayered laminate, comprising: stacking a plurality of signal/power plane substructures to for a stack of signal/power plane substructures, wherein a dielectric material of an intervening dielectric layer insulatively separates each pair of successive signal/power plane substructures; positioning a first continuously conductive layer on a first dielectric layer, the first dielectric layer stacked on a first side of the stack of signal/power plane substructures; positioning a second continuously conductive layer on a second dielectric layer, the second dielectric layer stacked on a second side of the stack of signal/power plane substructures; and applying heat and/or pressure to the resultant stack of signal/power plane substructures and the first and second dielectric layers and the first and second continuously conductive layers to form the multilayered laminate.

A second aspect of the present invention is an electrical structure, comprising: a multilayered laminate that includes in sequential order: (a) a first intermediate layer having microvias and conductive lands; (b) a plurality of signal/power plane substructures, wherein a dielectric material of an intervening dielectric layer insulatively separates each pair of successive signal/power plane substructures; and (c) a second intermediate layer having microvias and conductive lands.

DETAILED DESCRIPTION OF THE INVENTION

Figure 4:
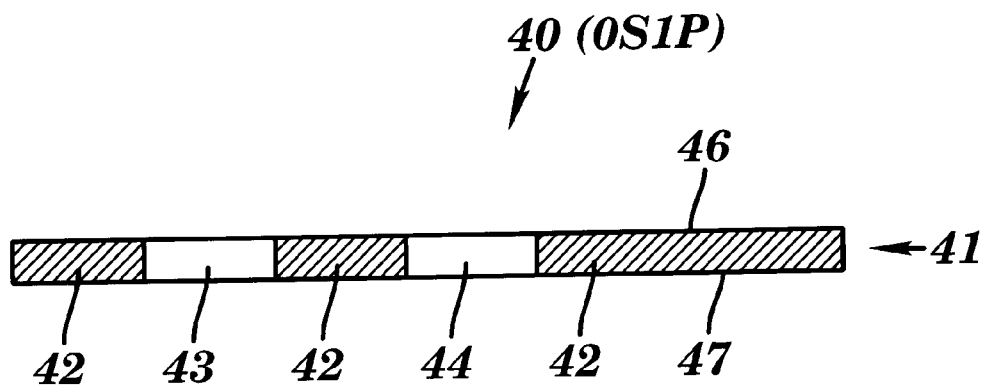
FIG. 4 depicts a front cross sectional view of a 0S1P substructure, in accordance with preferred embodiments of the present invention.
Figure 5:
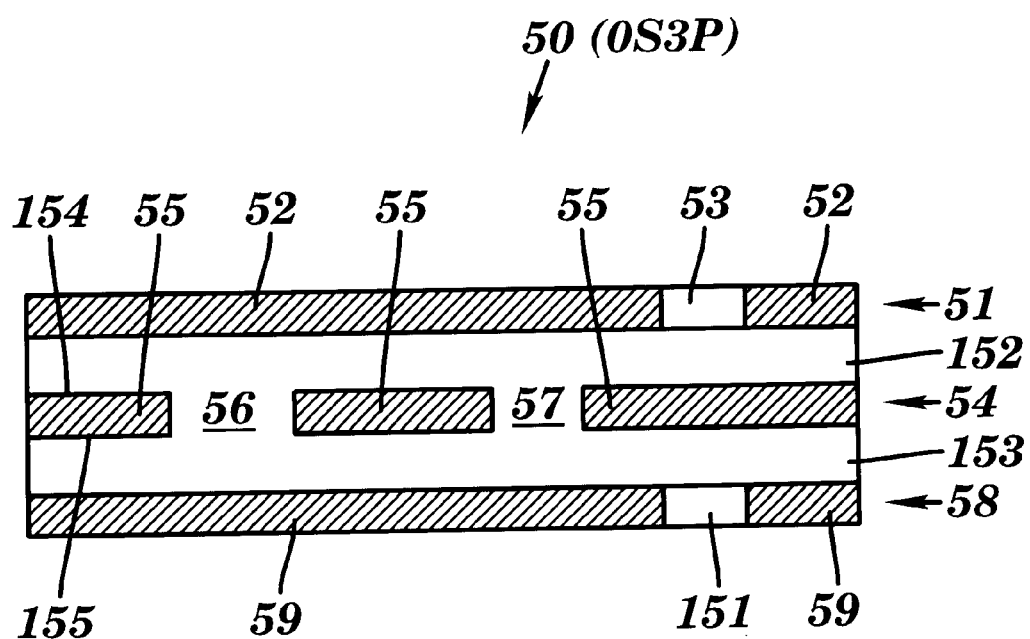
FIG. 5 depicts a front cross sectional view of a 0S3P substructure, in accordance with preferred embodiments of the present invention.
Figure 6:
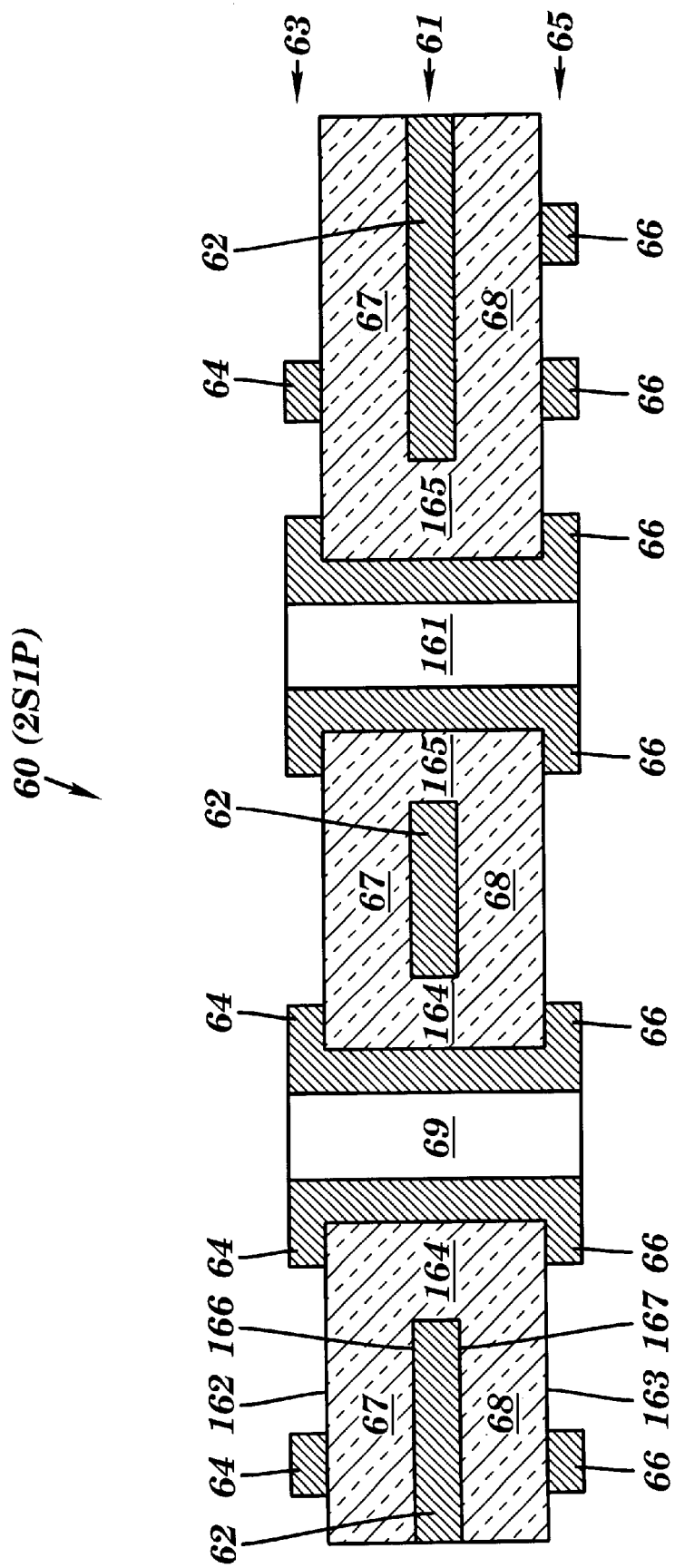
FIG. 6 depicts a front cross sectional view of a 2S1P substructure, in accordance with preferred embodiments of the present invention.

FIGS. 4, 5, and 6 illustrate conductive substructures in accordance with preferred embodiments of the present invention. FIG. 4 illustrates a 0S1P substructure 40, FIG. 5 illustrates a 0S3P substructure 50, and FIG. 6 illustrates a 2S1P substructure 60. The 0S1P substructure 40, the 0S3P substructure 50, and the 2S1P substructure 60 are named in accordance with the nSmP notation described supra. Thus, "0S1P" connotes 0 signal planes and 1 power plane (n=0, m=1), "0S3P" connotes 0 signal planes and 3 power planes (n=0, m=3), and "2S1P" connotes 2 signal planes and 1 power plane (n=2, m=1). Multilayered laminates in accordance with the present invention include stacked substructures which may include any or all of the 0S1P, 0S3P, and 2S1P substructures.

In FIG. 4, the 0S1P substructure 40 comprises a power plane 41. The power plane 41 includes a continuously conductive layer 42 having a hole 43 and a hole 44. The continuously conductive layer 42 may include, inter alia, a pure metal (e.g., copper), a metallic alloy, or a layered sandwich (e.g., a copper-Invar-copper sandwich with a sublayer of Invar sandwiched between sublayers of copper). While the continuously conductive layer 42 includes the two holes 43 and 44, the continuously conductive layer 42 may include any number of holes or no hole.

The 0S1P substructure 40 of FIG. 4 may be generated in accordance with preferred embodiments of the present invention as follows. Initially, the continuously conductive layer 42 would be provided as a sheet of the conductive material. Then the holes 43 and 44 may be formed in the continuously conductive layer 42, such as by mechanical drilling, laser drilling, or photolithographically. An example of how photolithography may be used to form the holes 43 and 44 includes applying a layer of photoresist to a surface of the continuously conductive layer 42, patterning and selectively exposing the photoresist to radiation (e.g., ultraviolet radiation) such that the photoresist is exposed only where the holes 43 and 44 are to be formed, etching away the exposed photoresist and the conductive material underneath the exposed photoresist to form the holes 43 and 44, and stripping away the unexposed photoresist to fully expose the conductive material of the continuously conductive layer 42. Note that a roll of the conductive material may initially replace the sheet of the conductive material of the conductive layer 42 in the aforementioned process for forming the 0S1P substructure 40, such that a portion of the roll of the conductive material may be cut away to constitute the sheet of the conductive material, wherein the cutting away may take place either before or after the holes 43 and 44 have been formed. Also note that the power plane 41 comprises the continuously conductive layer 42 and further includes any holes (such as the holes 43 and 44) that exist or have been formed through the continuously conductive layer 42. The surfaces 46 and 47 of the power plane 41 may be each coated or otherwise treated with a surface layer of material such as zinc, chrome, or copper oxide to promote adhesion of layers (e.g., dielectric layers) that will be subsequently applied to the surfaces 46 and 47. Note that the holes 43 and 44 may be formed either before or after any subsequent application of a dielectric layer to the surfaces 46 or the surface 47. A structure resulting from applying the dielectric layer to the surfaces 46 is called a 0S1P substructure.

In FIG. 5, the 0S3P substructure 50 comprises an interior power plane 54, a surface power plane 51, a surface power plane 58, a dielectric layer 152 between the power planes 54 and 51, and a dielectric layer 153 between the power planes 54 and 58. The power plane 54 includes a continuously conductive layer 55 having a hole 56 and a hole 57, wherein the holes 56 and 57 each include dielectric material from the dielectric layers 152 and 153. While the continuously conductive layer 55 includes the two holes 56 and 57, the continuously conductive layer 55 may include any number of holes or no hole. The power plane 51 includes a continuously conductive layer 52 having a hole 53. While the continuously conductive layer 52 includes the hole 53, the continuously conductive layer 52 may include any number of holes or no hole. The power plane 58 includes a continuously conductive layer 59 having a hole 151. While the continuously conductive layer 59 includes the hole 151, the continuously conductive layer 59 may include any number of holes or no hole. The continuously conductive layers 52, 55, and 59 may each include, inter alia, a pure metal (e.g., copper), a metallic alloy, or a layered sandwich (e.g., a copper-Invar-copper sandwich with a sublayer of Invar sandwiched between sublayers of copper). The continuously conductive layers 52, 55, and 59 may each include the same conductive material or different conductive materials. The dielectric layers 152 and 153 each comprise a dielectric material such as, inter alia, a photoimageable dielectric (PID) material, a pure resin material, an epoxy material, and a glass-reinforced dielectric.

The 0S3P substructure 50 of FIG. 5 may be generated in accordance with preferred embodiments of the present invention as follows. Initially, the power plane 54 having the continuously conductive layer 55 (including the holes 56 and 57) is formed in the same manner as the power plane 41 of FIG. 4 is formed, as described supra. After the continuously conductive layer 54 is formed, the dielectric layers 152 and 153 are respectively applied to opposite surfaces 154 and 155, respectively, of the continuously conductive layer 54. Prior to the application of the dielectric layers 152 and 153, the opposite surfaces 154 and 155 may be each coated or otherwise treated with a surface layer of material such as zinc, chrome, or copper to promote adhesion of the dielectric layers 152 and 153 to the surfaces 154 and 155, respectively. The dielectric material of the dielectric layers 152 and 153 fills the holes 56 and 57 during the application of the dielectric layers 152 and 153. Then the power planes 51 and 58 may be formed by applying a sheet of a conductive material (in the form of a separate sheet or from a roll) on the dielectric layers 152 and 153. The holes 53 and 151 in the power planes 51 and 58 respectively, may be formed in the same manner (i.e., pholithographically with selective etching) as the holes 43 and 44 are formed in the power plane 41 as described supra in conjunction with FIG. 4. The holes 53 and 151 may be formed in the power planes 51 and 58, respectively, either before or after the planes 51 and 58 are applied to the dielectric layers 152 and 153, respectively. Note that the dielectric layers 152 and 153 may initially be in a form of complete sheets or alternatively may be cut from a roll of dielectric material before or after being applied to the power plane 54.

In FIG. 6, the 2S1P substructure 60 comprises an interior power plane 61, a signal plane 63 a signal plane 65, a dielectric layer 67 interfaced between the power plane 61 and the signal plane 63, and a dielectric layer 68 interfaced between the power plane 61 and the signal plane 65. The 2S1P substructure 60 also includes the plated via 69 and the plated via 161. The power plane 61 includes a continuously conductive layer 62 having a hole 164 and a hole 165, wherein the holes 164 and 165 each include dielectric material from the dielectric layers 67 and 68. While the continuously conductive layer 62 includes the two holes 164 and 165, the continuously conductive layer 62 may include any number of holes or no hole. The continuously conductive layer 62, and the signal layers 63 and 65, may each include, inter alia, a pure metal (e.g., copper), a metallic alloy, or a layered sandwich (e.g., a copper-Invar-copper sandwich with a sublayer of Invar sandwiched between sublayers of copper). The continuously conductive layer 62, and the signal layers 63 and 65, may each include the same conductive material or different conductive materials. The dielectric layers 67 and 68 each comprise a dielectric material such as, inter alia, a photoimageable dielectric (PID) material, a pure resin material, an epoxy material, and a glass-reinforced dielectric material. The 2S1P substructure 60 also includes the plated via 69 and the plated via 161. While the 2S1P substructure 60 includes the two plated vias 69 and via 161, the 2S1P substructure 60 may include any number of plated vias or no plated via. Additionally, 2S1P substructure 60 may include any number of unplated vias or no unplated via.

The 2S1P substructure 60 of FIG. 6 may be generated in accordance with preferred embodiments of the present invention as follows. Initially, the power plane 61 comprising the continuously conductive layer 62 (including the holes 164 and 165) is formed in the same manner as the power plane 41 of FIG. 4 is formed, as described supra. After the power plane 61 is formed, the dielectric layers 67 and 68 are applied to opposite surfaces 166 and 167, respectively, of the continuously conductive layer 62. Prior to the application of the dielectric layers 67 and 68, the opposite surfaces 166 and 167 may be each coated or otherwise treated with a surface layer of material such as zinc, chrome, or copper oxide to promote adhesion of the dielectric layers 67 and 68 to the surfaces 166 and 167, respectively. The dielectric material of the dielectric layers 67 and 68 fills the holes 164 and 165 during the application of the dielectric layers 67 and 68. Note that the dielectric layers 67 and 68 may initially be in a form of complete sheets or alternatively may be cut from a roll of dielectric material before or after being applied to the power plane 61. Next, sheets of conductive material, which may include a conductive metal such as copper, may be applied to the surfaces 162 and 163 of the dielectric layers 67 and 68, respectively. The signal planes 63 and 65 will be subsequently formed from said sheets of conductive material. Alternatively, the aforementioned sheets of conductive metal may be applied (e.g. coated) to the dielectric layers 67 and 68 (either in sheet or roll format) prior to applying the dielectric layers 67 and 68 to the surfaces 166 and 167, respectively. The aforementioned sheets of conductive metal may be circuitized to form the signal planes 63 and 65 by a subtractive process that comprises a photolithographic process followed by selective etching which removes conductive metal from the sheets of conductive metal where there is to be no circuitization.

An alternative method of forming the signal planes 63 and 65 is by an additive process that eliminates use of the aforementioned sheets of conductive metal. Instead, permanent or temporary photoresist layers are formed on the surfaces 162 and 163. The photoresist is patterned and photolithographically exposed to radiation (e.g., ultraviolet radiation). Then channels are formed in the photoresist layers by selective etching. The channels are filled, such as by being plated, with an electrically conductive material (e.g., copper) that forms circuitization of the signal planes 63 and 65. If the photoresist layers were intended to be temporary, then the remaining photoresist is removed by any method known to one of ordinary skill in the art such as by chemical etching. Regardless of the method of formation, the signal planes 63 and 65 may be formed simultaneously, in overlapping periods of time, or within distinct periods of time.

Plated vias 69 and 161 of the 2S1P substructure 60 may be formed by mechanical or laser drilling of holes through: the conductive material of the signal plane 63, the dielectric material of the dielectric layer 67, the dielectric material within the power plane 61, the dielectric material of the dielectric layer 68, and the signal plane 65, followed by plating the holes with a conductive material. Alternatively, the plated vias 69 and 161 could be formed by mechanical or laser drilling of the holes prior to forming the signal planes 63 and 65. An additional alternative is available if the dielectric material of the of the dielectric layers 67 and 68 includes a PID material. With the additional alternative, the plated vias 69 and 161 could be formed by patterned photoimaging and selective etching the PID material prior to forming the signal planes 63 and 65.

The dielectric material within the 0S3P substructure 50 of FIG. 5 and within the 2S1P substructure 60 of FIG. 6, is initially provided as uncured. The dielectric material may be cured after being applied to within the 0S3P substructure 50 or to within the 2S1P substructure 60. The 2S1P substructure 60 of FIG. 6 may be cured, inter alia, by heating or by pressurizing followed by heating. Alternatively if the dielectric material includes PID material, then the dielectric material may be photocured (e.g., by use of ultraviolet radiation). For the 2S1P substructure 60 of FIG. 6, the dielectric material is cured preferably before the plated vias 69 and 161 are formed.

Figure 7:
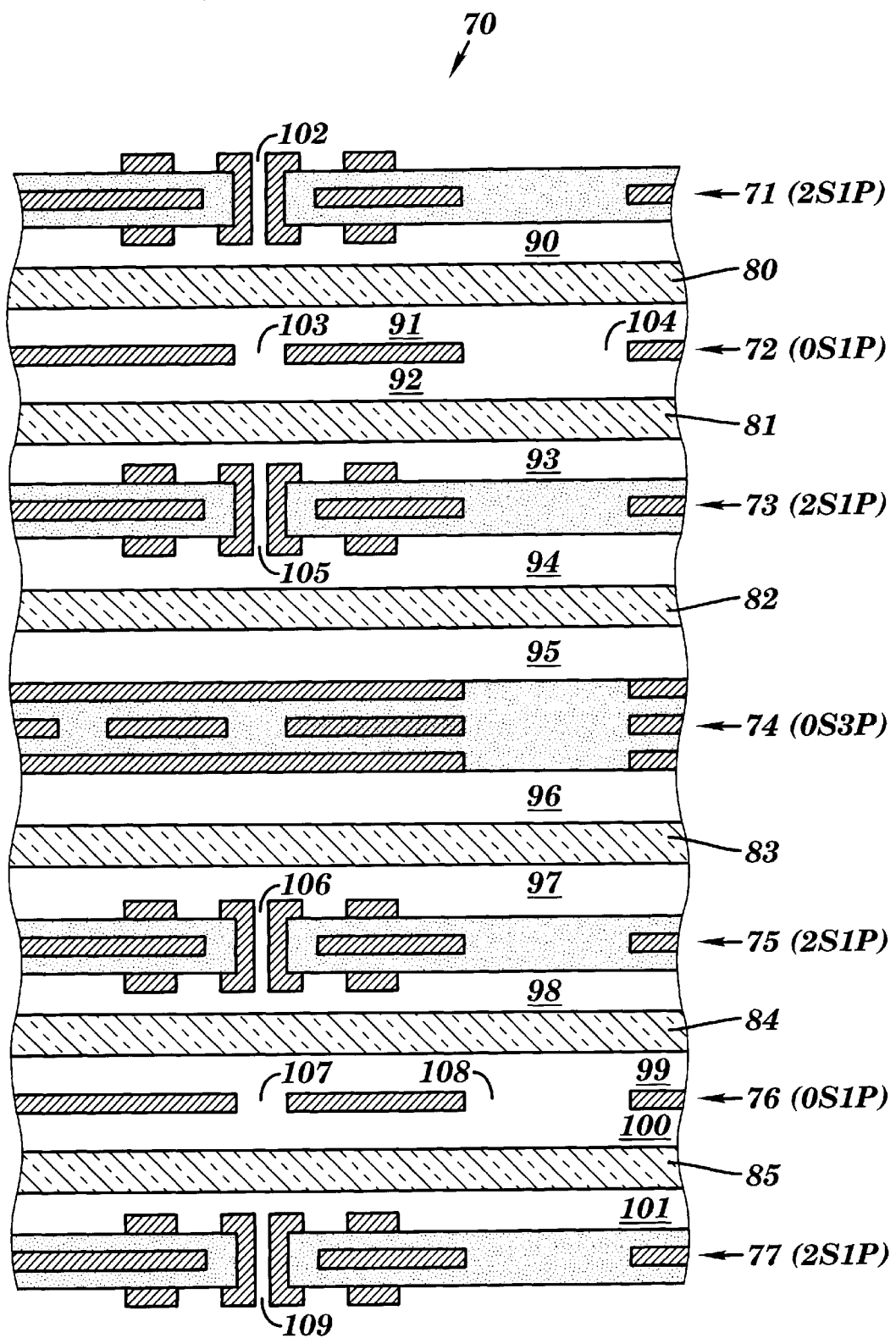
FIG. 7 depicts a multilayered laminate that includes 0S1P, 0S3P, and 2S1P substructures, in accordance with preferred embodiments of the present invention.

FIG. 7 illustrates a multilayered laminate 70 that includes 0S1P, 0S3P, and 2S1P substructures, in accordance with preferred embodiments of the present invention. In particular, the multilayered laminate 70 includes the following sequentially stacked arrangement of substructures and dielectric layers: a 2S1P substructure 71, a dielectric layer 80, a 0S1P substructure 72, a dielectric layer 81, a 2S1P substructure 73, a dielectric layer 82, a 0S3P substructure 74, a dielectric layer 83, a 2S1P substructure 75, a dielectric layer 84, a 0S1P substructure 76, a dielectric layer 85, and a 2S1P substructure 77.

Although the aforementioned sequentially stacked substructures 71–77 and dielectric layers 80–85, will be subsequently subjected to compressive stresses, they have not yet been subject to said compressive stresses. Accordingly, the sequentially stacked substructures 71–77 and dielectric layers 80–85 have intervening void regions 90–101 as follows. The void region 90 intervenes between the 2S1P substructure 71 and the dielectric layer 80. The void region 91 intervenes between the dielectric layer 80 and the 0S1P substructure 72. The void region 92 intervenes between the 0S1P substructure 72 and the dielectric layer 81. The void region 93 intervenes between the dielectric layer 81 and the 2S1P substructure 73. The void region 94 intervenes between the 2S1P substructure 73 and the dielectric layer 82. The void region 95 intervenes between the dielectric layer 82 and the 0S3P substructure 74. The void region 96 intervenes between the 0S3P substructure 74 and the dielectric layer 83. The void region 97 intervenes between the dielectric layer 83 and the 2S1P substructure 75. The void region 98 intervenes between the 2S1P substructure 75 and the dielectric layer 84. The void region 99 intervenes between the dielectric layer 84 and the 0S1P substructure 76. The void region 100 intervenes between the 0S1P substructure 76 and the dielectric layer 85. The void region 101 intervenes between the dielectric layer 85 and the 2S1P substructure 77. Note that void space also exists in: a plated via 102 of the 2S1P substructure 71, holes 103 and 104 in the 0S1P substructure 72, a plated via 105 of the 2S1P substructure 73, a plated via 106 of the 2S1P substructure 75, holes 107 and 108 in the 0S1P substructure 76, and a plated via 109 of the 2S1P substructure 77.

The 0S1P substructures 72 and 76 of the multilayered laminate 70 in FIG. 7 have the same properties and features as were described supra in conjunction with FIG. 4 for the 0S1P substructure 40. The 0S3P substructure 74 of the multilayered laminate 70 in FIG. 7 has the same properties and features as were described supra in conjunction with FIG. 5 for the 0S3P substructure 50. The 2S1P substructures 71, 73, 75, and 77 of the multilayered laminate 70 in FIG. 7 have the same properties and features as were described supra in conjunction with FIG. 6 for the 2S1P substructure 60.

Figure 1:
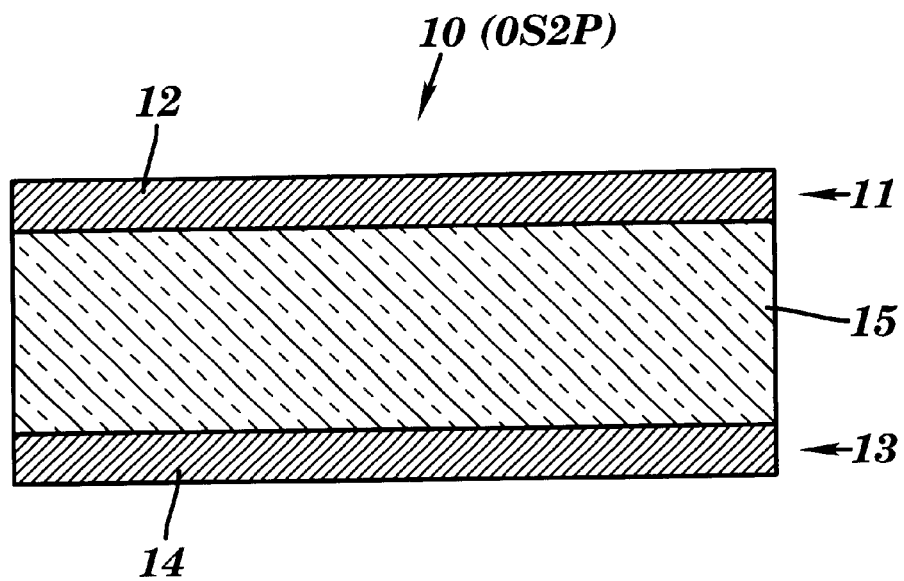
FIG. 1 depicts a front cross sectional view of a 0S2P substructure, in accordance with the related art.
Figure 2:
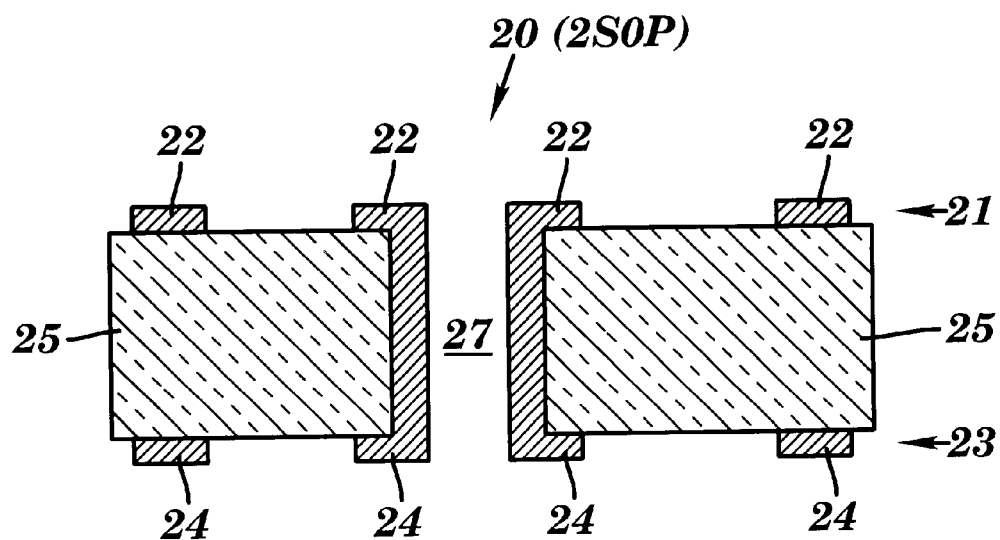
FIG. 2 depicts a front cross sectional view of a 2S0P substructure, in accordance with the related art.
Figure 3:
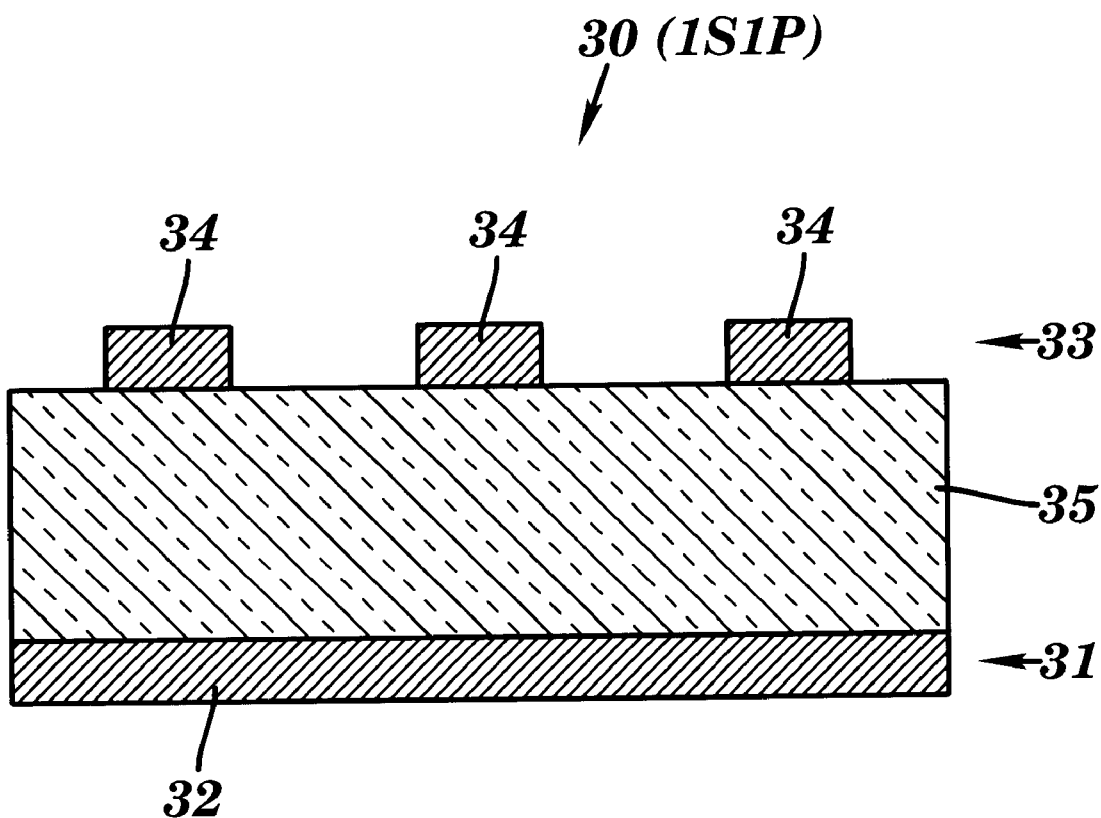
FIG. 3 depicts a front cross sectional view of a 1S1P substructure, in accordance with the related art.

The particular arrangement of 0S1P, 0S3P, and 2S1P substructures in FIG. 7 is merely illustrative of the numerous possible arrangements. Generally, a multilayered laminate of the present invention may include any number and arrangements of 0S1P, 0S3P, and 2S1P substructures. Any or all of 0S1P, 0S3P, and 2S1P substructures may be present in the multilayered laminate. A multilayered laminate that comprises a 0S1P substructure and a 0S3P substructure, with no internal signal layers, may be useful in a power distribution system or in a structure with all circuitization on the external, exposed surfaces of the multilayered laminate. Note that a multilayered laminate may additionally include conventional substructures such as the 0S2P substructure 10, the 2S0P substructure 20, and the 1S1P substructure 30, described supra in conjunction with FIG. 1, FIG. 2, and FIG. 3, respectively.

Figure 8:
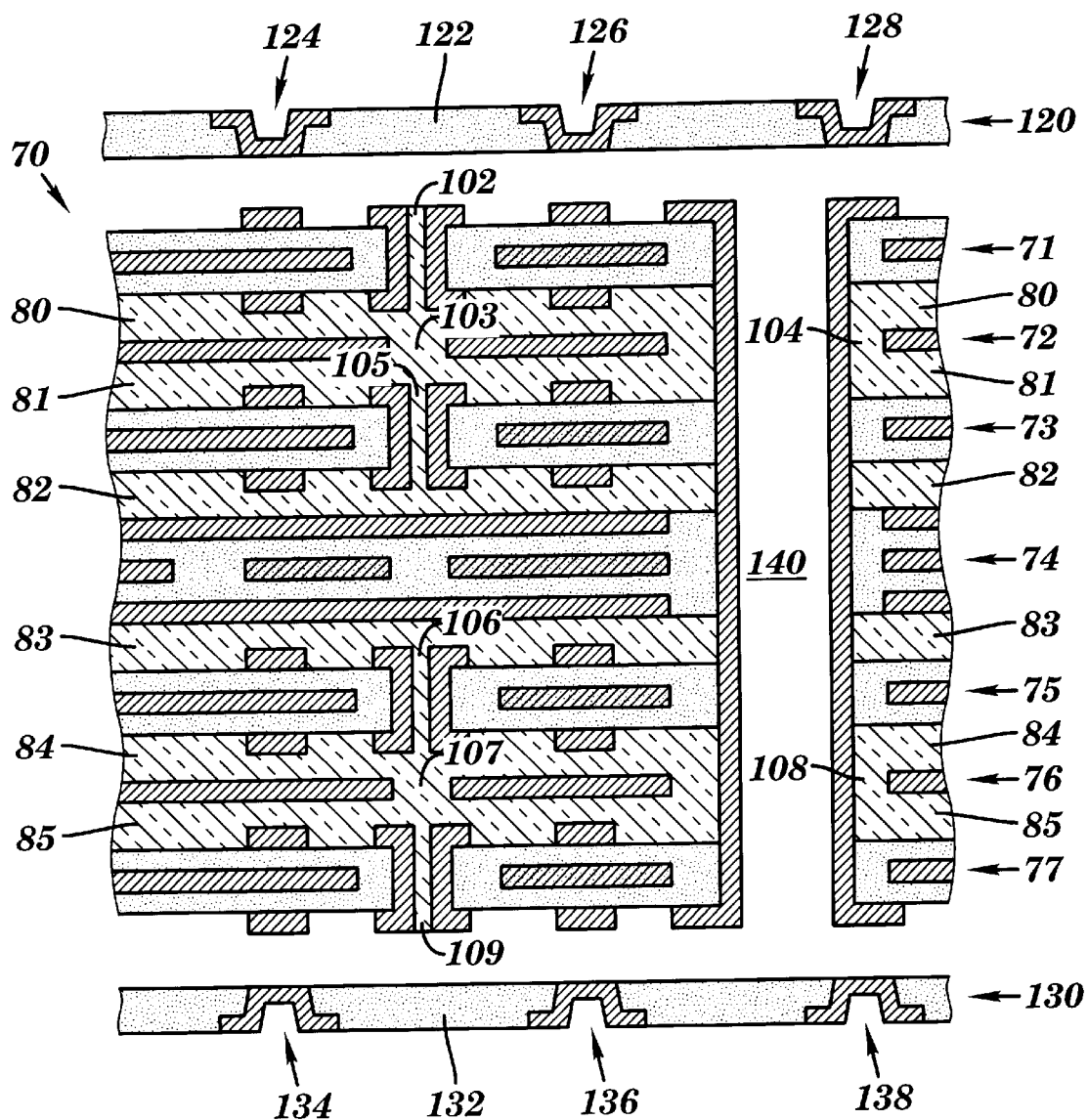
FIG. 8 depicts the multilayered laminate of FIG. 7 after being compressed.

FIG. 8 illustrates the multilayered laminate 70 of FIG. 7 after being compressed under an elevated temperature, such as by pressurization in a lamination press under a pressure preferably between about 100 psi and about 700 psi at a temperature preferably between about 180° C. and about 210° C. The compression and heating of the dielectric material of the dielectric layers 80–85 causes said dielectric material to flow. The heating of the dielectric material of the dielectric layers 80–85 cures said dielectric material. The compression of the multilayered laminate 70 eliminates the void regions 91–101 which were discussed supra in conjunction with FIG. 7. As a result of the compression, the dielectric material of the dielectric layers 80–85 fills out the prior void spaces between, and insulatively separates, each pair of successive substructures of the substructures 71–77 as follows. The dielectric material of the dielectric layer 80 fills the space between, and insulatively separates, the 2S1P substructure 71 and the 0S1P substructure 72. The dielectric material of the dielectric layer 81 fills the space between (and insulatively separates) the 0S1P substructure 72 and the 2S1P substructure 73. The dielectric material of the dielectric layer 82 fills the space between, and insulatively separates, the 2S1P substructure 73 and the 0S3P substructure 74. The dielectric material of the dielectric layer 83 fills the space between, and insulatively separates, the 0S3P substructure 74 and the 2S1P substructure 75. The dielectric material of the dielectric layer 84 fills the space between, and insulatively separates, the 2S1P substructure 75 and the 0S1P substructure 76. The dielectric material of the dielectric layer 85 fills the space between, and insulatively separates, the 0S1P substructure 76 and the 2S1P substructure 77.

From the aforementioned flow and cure of dielectric material, the dielectric material of the dielectric layers 80–85 fill out the space in the plated vias and power planes as follows. The plated via 102 of the 2S1P substructure 71 is filled with dielectric material from the dielectric layer 80. The holes 103 and 104 in the 0S1P substructure 72 are filled with dielectric material from the dielectric layers 80 and 81. The plated via 105 of the 2S1P substructure 73 is filled with dielectric material from the dielectric layers 81 and 82. The plated via 106 of the 2S1P substructure 75 is filled with dielectric material from the dielectric layers 83 and 84. The holes 107 and 108 in the 0S1P substructure 76 are filled with dielectric material from the dielectric layers 84 and 85. The plated via 109 of the 2S1P substructure 77 is filled with dielectric material from the dielectric layer 85.

After the multilayered laminate 70 has been compressed, a plated through hole (PTH) 140 may be formed through the multilayered laminate 70. The PTH 140 may be formed by any method known to one of ordinary skill in the art, such as mechanical or laser drilling. Although FIG. 8 does not explicitly show the PTH 140 as being electrically (i.e., conductively) coupled to any of the substructures 71–77, the PTH 140 and the substructures 71–77 may be formed such that the PTH 140 conductively contacts some or all of the substructures 71–77. Thus the PTH 140 may be used to provide electrical coupling among or between some or all of the substructures 71–77. Additionally, the PTH 140 may be conductively coupled to electronic structures external to the multilayered laminate 70 (e.g., a chip) as will be discussed infra in conjunction with FIG. 9.

Figure 9:
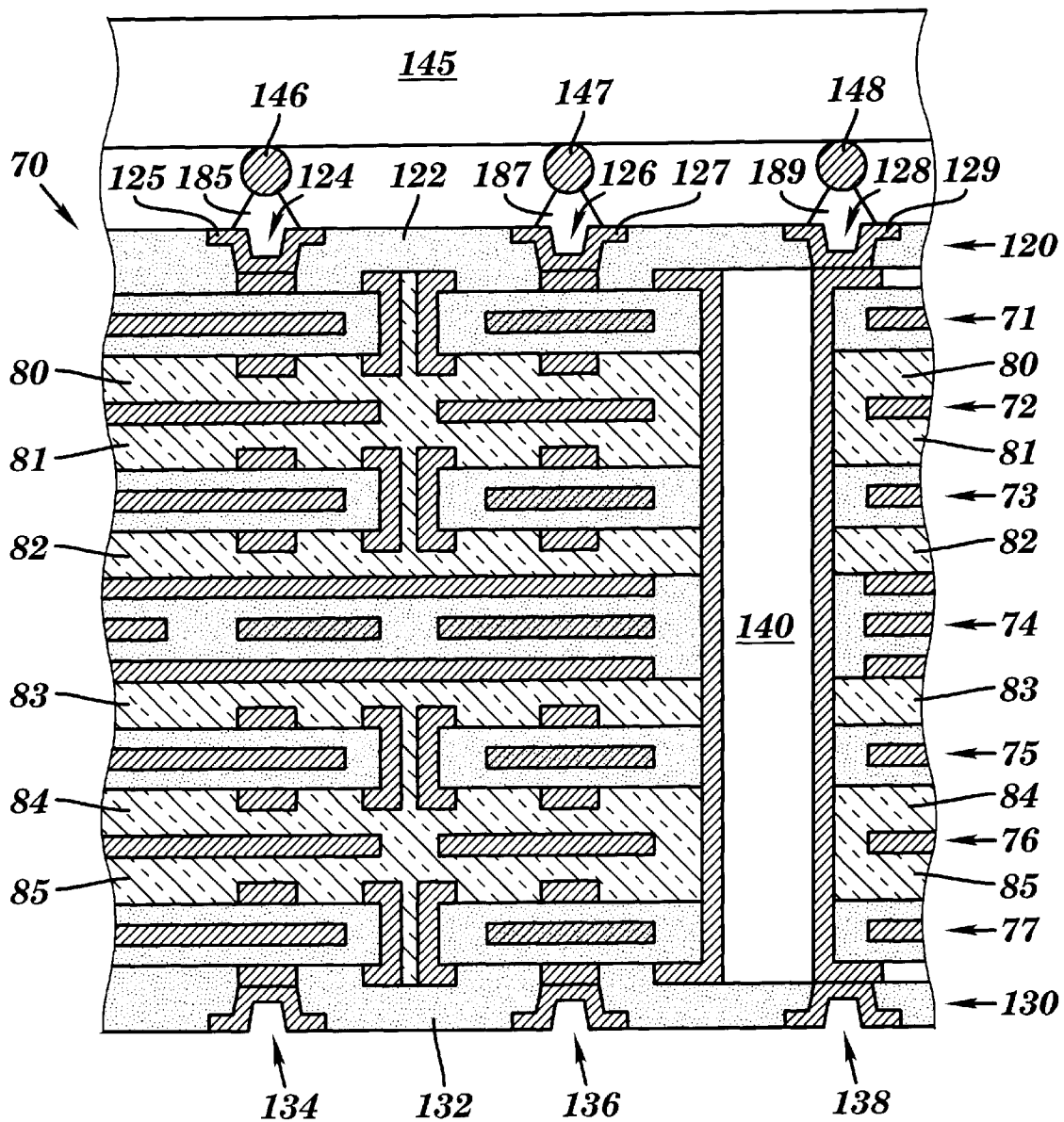
FIG. 9 depicts the multilayered laminate of FIG. 8 after surface layers have been applied to the multilayered laminate.

The surface layers 120 and 130, if present, may be applied to the multilayered laminate 70 as will be shown infra in conjunction with FIG. 9. The surface layer 120 includes a dielectric sheet 122, a microvia 124, a microvia 126, and a microvia 128, such that the microvias 124, 126, and 128 are within the dielectric sheet 122. The microvias 124, 126, and 120 each have a plated layer of conductive material (e.g., copper). The surface layer 130 includes a dielectric sheet 132, a microvia 134, a microvia 136, and a microvia 138, such that the microvias 134, 136, and 138 are within the dielectric sheet 132. The microvias 134, 136, and 138 each have a plated layer of conductive material (e.g., copper). The surface layers 120 and 130 may serve to effectuate electrically conductive coupling between the multilayered laminate 70 and external electronic structures. For example, the surface layer 120 may conductively couple a semiconductor chip to the multilayered laminate 70 by use of some or all of the microvias 124, 126, and 128, as discussed infra in conjunction with FIG. 9. As another example, the surface layer 130 may conductively couple a solder ball of a ball grid array (BGA) to the multilayered laminate 70 by use of some or all of the microvias 134, 136, and 138. The dielectric sheets 122 and 132 may include any dielectric material having structural and insulative properties that support said conductive coupling between the multilayered laminate 70 and the external electronic structures. The dielectric material within the dielectric sheets 122 and 132 preferably includes a resin comprising an allylated polyphenylene ether (APPE). A particularly useful APPE is an APPE resin coated on a copper foil, made by the Asahi Chemical Company of Japan and identified as Asahi product number PC5103. Alternatively, the dielectric material within the dielectric sheets 122 and 132 may include a photoimageable dielectric or a resin-coated copper foil. Although the surface layers 120 and 130 are each shown in FIG. 8 to include three microvias, the surface layers 120 and 130 may each include any number of microvias, or no microvia. The number of microvias included within the surface layer 120 may be unrelated to the number of microvias included within the surface layer 130. In addition to having microvias, the surface layers 120 and 130 may each include surface circuitization lines.

FIG. 9 illustrates FIG. 8 after the surface layers 120 and 130 have been applied to the multilayered laminate 70 by any method that is compatible with the particular dielectric material used in the dielectric sheet 122 and 132, respectively. For example, the surface layers 120 and 130, if including the allylated polyphenylene ether (APPE) that is initially coated on a copper foil such as the Asahi resin PC5103 (discussed supra), may be applied to the multilayered laminate 70 by pressurization in a range of about 1000 psi to about 2000 psi at an elevated temperature between about 180° C. and about 210° C. for a time of at least about 90 minutes. The pressurization and elevated temperatures causes the APPE resin to flow and become cured, resulting in application of the surface layers 120 and 130 to the multilayered laminate 70. After the pressurization, the copper foils may be left intact, or removed in any manner known to one of ordinary skill in the art, such as by etching.

Although the preceding discussion described how the surface layers 120 and 130 may be applied to the multilayered laminate 70 after to the multilayered laminate 70 has been compressed as described supra in conjunction with FIG. 7, the surface layers 120 and 130 may alternatively be applied to the multilayered laminate 70 prior to the compression of the multilayered laminate 70 as follows. The dielectric sheets 122 and 132 (without added metalization or circuitization) of the surface layers 120 and 130, respectively, are placed on the multilayered laminate 70. When the multilayered laminate 70 is subsequently compressed by use of a compressive force, the dielectric sheets 122 and 132 are subject to the compressive force and are thus caused to adhere to the multilayered laminate 70. After the compression, the microvias 124, 126, 128, 134, 136, and 138 (and associated plating) may be formed in the surface layers 120 and 130 as shown in FIG. 8 and discussed supra in the text that describes FIG. 8. Also after the compression, the plated through hole 140 may be formed as discussed supra in conjunction with FIG. 8. The plated through hole 140 thus formed would pass through the surface layer 120, the multilayered laminate 70, and the surface layer 130.

The microvias 124, 126, and 128 are formed in the surface layer 120 after the surface layer 120 has been applied to the multilayered laminate 70. Similarly, the microvias 134, 136, and 138 are formed in the surface layer 130 after the surface layer 130 has been applied to the multilayered laminate 70. The microvias 124, 126, and 128, as well as the microvias 134, 136, and 138, may be formed by any method known to one of ordinary skill in the art, such as by laser drilling into the dielectric sheet 122 down to the conductive metalization on the signal layer 120 to form a microvia, followed by electroless plating of metal (e.g., copper) on seeded surfaces (e.g., palladium seeded surfaces) of the microvia to form an electroless layer of the metal. After the electroless plating, the metal (e.g., copper) is electroplated over the electroless layer to form the plated layer of each of microvias 124, 126, 128, 134, 136, and 138.

In FIG. 9, an electrical device 145 (e.g., a semiconductor chip) has been coupled to the multilayered laminate 70 by solder contact members 146, 147, and 148. The solder contact members 146, 147, and 148 are conductively coupled to the solder interfaces 185, 187, and 189 within the microvias 124, 126, and 128, respectively. The plated layers 125, 127, and 129 of the microvias 124, 126, and 128, respectively, are conductively coupled to the multilayered laminate 70 at the 2S1P substructure 71 and at the plated through hole 140. The solder contact members 146, 147, and 148 may each include, inter alia, a Controlled Collapse Chip Connection (C4) solder ball. If the surface layer 120 is not present, then the electrical device 145 may be conductively coupled directly to the multilayered laminate 70 at the 2S1P substructure 71 and at the plated through hole 140.

Figure 10:
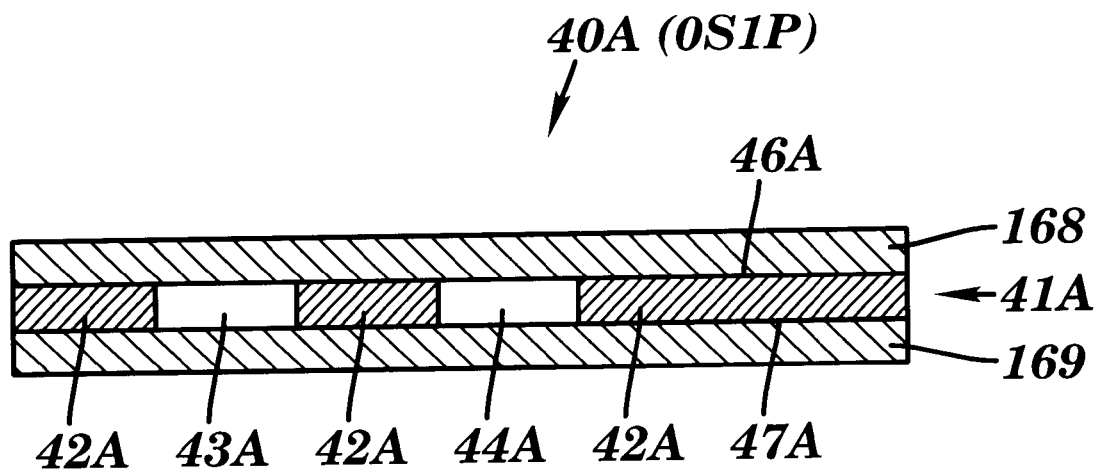
FIG. 10 depicts a front cross sectional view of an alternative 01S1P substructure, in accordance with preferred embodiments of the present invention.

FIG. 10 depicts a front cross sectional view of an alternative 0S1P substructure, in accordance with preferred embodiments of the present invention. In FIG. 10, the alternative 0S1P substructure 40A comprises a power plane 41A and a dielectric layer 168 applied to a surface 46A and a dielectric layer applied to a surface 47A. The power plane 41A includes a continuously conductive layer 42A having a hole 43A and a hole 44A. The continuously conductive layer 42A may each include, inter alia, a pure metal (e.g., copper), a metallic alloy, or a layered sandwich (e.g., a copper-Invar-copper sandwich with a sublayer of Invar sandwiched between sublayers of copper). Power plane 41A is identical to power plane 41 illustrated in FIG. 4 and described supra except holes 43A and 44A include dielectric material from the dielectric layers 168 and 169. The dielectric layers 168 and 169 each comprise a dielectric material such as, inter alia, a PID material, a pure resin material, an epoxy material, a glass-reinforced dielectric, an allylated polyphenylene ether (APPE) resin or a silica filled polytetrafluoroethylene (PTFE) resin such as Rogers 2800 made by the Rogers Corporation of Rogets, Conn.

The 0S1P substructure 40A of FIG. 10 may be generated in accordance with preferred embodiments of the present invention as follows. Prior to the application of the dielectric layers 168 and 169, the surfaces 46A and 47A may be each coated or otherwise treated with a surface layer of material such as zinc, chrome, or copper to promote adhesion of the dielectric layers 168 and 169 to the surfaces 46A and 47A, respectively. The dielectric material of the dielectric layers 168 and 169 fills the holes 43A and 44A during the application of the dielectric layers 168 and 169. Note that the dielectric layers 168 and 169 may initially be in a form of complete sheets or alternatively may be cut from a roll of dielectric material before or after being applied to the power plane 41A.

Figure 11:
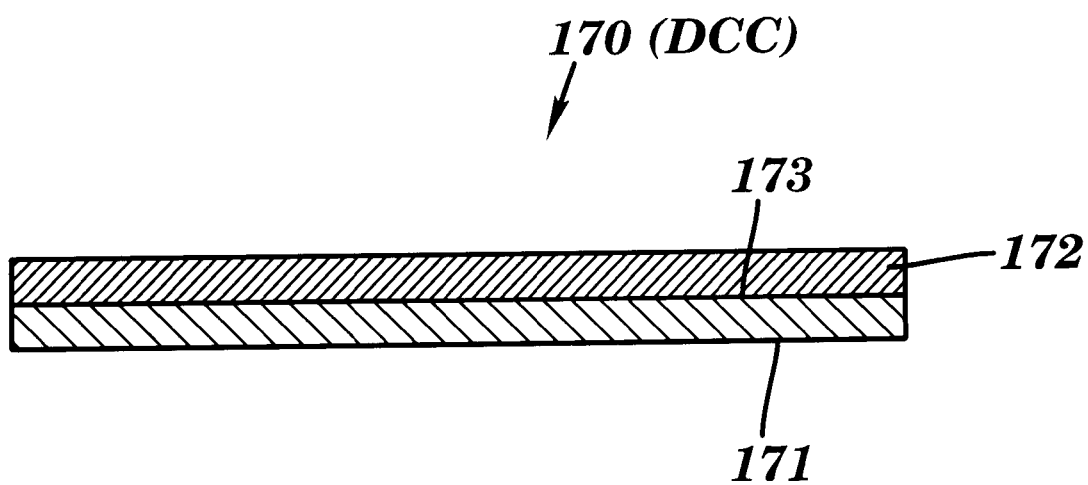
FIG. 11 depicts a front cross sectional view of a dielectric coated conductor (DCC) substructure, in accordance with preferred embodiments of the present invention.

FIG. 11 depicts a front cross sectional view of a dielectric coated conductor (DCC) substructure, in accordance with preferred embodiments of the present invention. DCC substructure 170 includes a dielectric layer 171 and a continuously conductive layer 172 on a surface 173 of the dielectric layer 171. The dielectric layer 171 comprises a dielectric material such as, inter alia, a PID material, a pure resin material, an epoxy material, a glass-reinforced dielectric, an allylated polyphenylene ether (APPE) resin or a silica filled polytetraflouroethylene (PTFE) resin such as Rogers 2800 made by the Rogers Corporation of Rogers, Conn. DCC substructure 170 may be resin coated on a copper foil such as made by the Asahi Chemical Company of Japan and identified as Asahi product number PC5103. The continuously conductive layer 172 may each include, inter alia, a pure metal (e.g., copper), a metallic alloy, or a layered sandwich (e.g., a copper-Invar-copper sandwich with a sublayer of Invar sandwiched between sublayers of copper). When the dielectric layer 171 is resin and the continuously conductive layer 172 is copper, the DCC substructure 170 is commonly referred to as resin coated copper (RCC).

Figure 12:
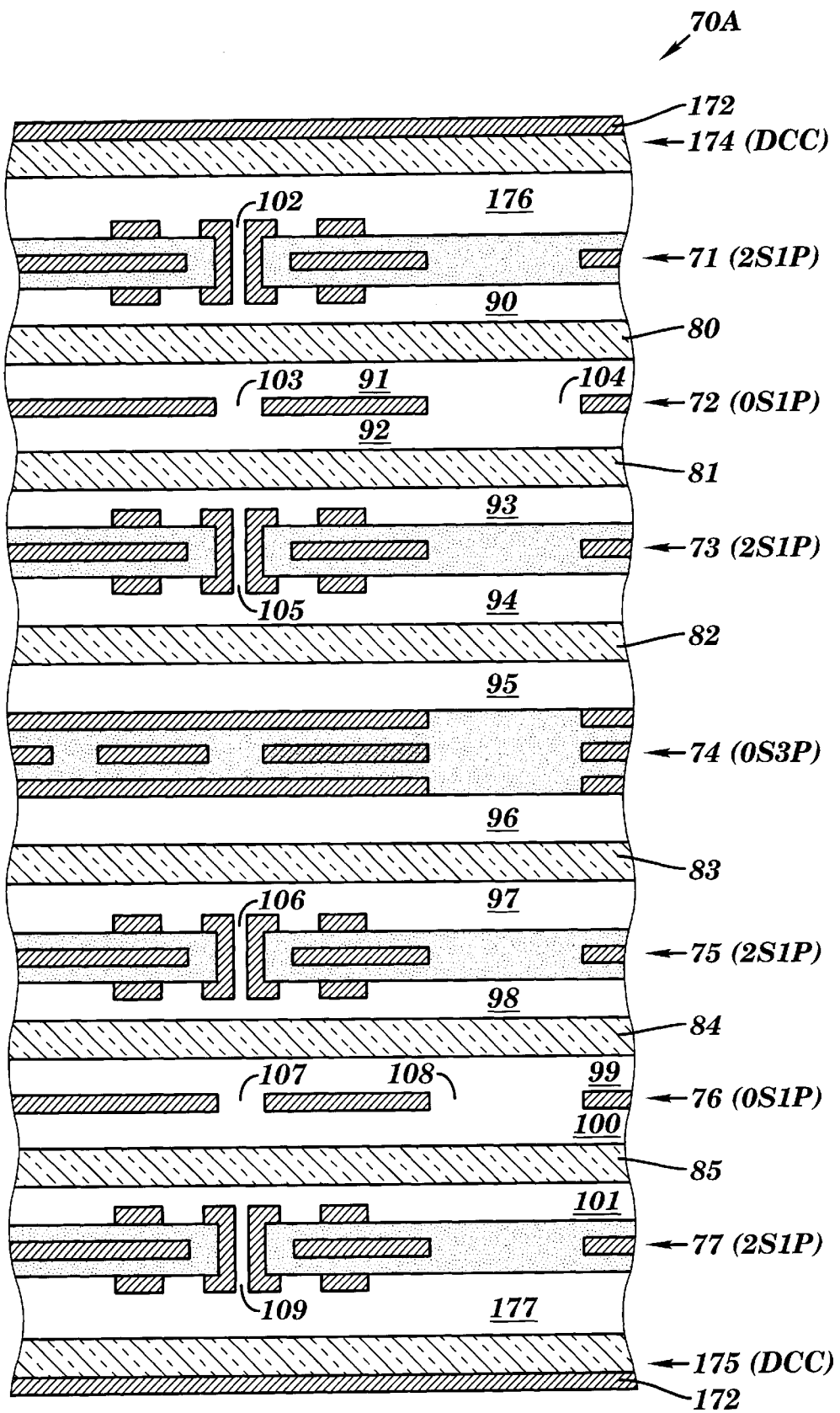
FIG. 12 depicts a multilayered laminate that includes DCC, 0S1P, 0S3P, and 2S1P substructures, in accordance with preferred embodiments of the present invention.

FIG. 12 depicts a multilayered laminate that includes DCC, 0S1P, 0S3P, and 2S1P substructures, in accordance with preferred embodiments of the present invention. In particular, the multilayered laminate 70A includes the following sequentially stacked arrangement of substructures and dielectric layers: a DCC substructure 174, a 2S1P substructure 71, a dielectric layer 80, a 0S1P substructure 72, a dielectric layer 81, a 2S1P substructure 73,, a dielectric layer 82, a 0S3P substructure 74, a dielectric layer 83, a 2S1P substructure 75, a dielectric layer 84, a 0S1P substructure 76, a dielectric layer 85, a 2S1P substructure 77, and a DCC substructure 175. With the exception of the added DCC substructures 174 and 175, the multilayered laminate 70A is identical with the multilayered laminate 70 illustrated in FIG. 7 and described supra.

Although the aforementioned sequentially stacked substructures 174, 71–77 and 175 and dielectric layers 80–85, will be subsequently subjected to compressive stresses, they have not yet been subject to said compressive stresses. Accordingly, the sequentially stacked substructures 174, 71–77 and 175 and dielectric layers 80–85 have intervening void regions 176, 90–101, and 177 as follows. The void region 176 intervenes between the DCC substructure 174 and the 2S1P substructure 71. The void region 90 intervenes between the 2S1P substructure 71 and the dielectric layer 80. The void region 91 intervenes between the dielectric layer and the 0S1P substructure 72. The void region 92 intervenes between the 0S1P substructure 72 and the dielectric layer 81. The void region 93 intervenes between the dielectric layer 81 and the 2S1P substructure 73. The void region 94 intervenes between the 2S1P substructure 73 and the dielectric layer 82. The void region 95 intervenes between the dielectric layer 82 and the 0S3P substructure 74. The void region 96 intervenes between the 0S3P substructure 74 and the dielectric layer 83. The void region 97 intervenes between the dielectric layer 83 and the 2S1P substructure 75. The void region 98 intervenes between the 2S1P substructure 75 and the dielectric layer 84. The void region 99 intervenes between the dielectric layer 84 and the 0S1P substructure 76. The void region 100 intervenes between the 0S1P substructure 76 and the dielectric layer 85. The void region 101 intervenes between the dielectric layer 85 and the 2S1P substructure 77. The void region 177 intervenes between the 2S1P substructure 77 and the DCC substructure 175. Note that void space also exists in: a plated via 102 of the 2S1P substructure 71, holes 103 and 104 in the 0S1P substructure 72, a plated via 105 of the 2S1P substructure 73, a plated via 106 of the 2S1P substructure 75, holes 107 and 108 in the 0S1P substructure 76, and a plated via 109 of the 2S1P substructure 77.

The 0S1P substructures 72 and 76 of the multilayered laminate 70A in FIG. 12 have the same properties and features as were described supra in conjunction with FIG. 4 for the 0S1P substructure 40. The 0S3P substructure 74 of the multilayered laminate 70A in FIG. 12 has the same properties and features as were described supra in conjunction with FIG. 5 for the 0S3P substructure 50. The 2S1P substructures 71 , 73, 75, and 77 of the multilayered laminate 70A in FIG. 12 have the same properties and features as were described supra in conjunction with FIG. 6 for the 2S1P substructure 60. The DCC substructures 174 and 175 of the multilayered laminate 70A in FIG. 12 have the same properties and features as were described supra in conjunction with FIG. 11 for the DCC substructure 170.

The particular arrangement of 0S1P, 0S3P, and 2S1P substructures in FIG. 12 is merely illustrative of the numerous possible arrangements. Generally, a multilayered laminate of the present invention may include any number and arrangements of 0S1P, 0S3P, and 2S1P substructures. Any or all of 0S1P, 0S3P, and 2S1P substructures may be present in the multilayered laminate. A multilayered laminate that comprises a 0S1P substructure and a 0S3P substructure, with no internal signal layers, may be useful in a power distribution system or in a structure with all circuitization on the external, exposed surfaces of the multilayered laminate. Note that a multilayered laminate may additionally include conventional substructures such as the 0S2P substructure 10, the 2S0P substructure 20, and the 1S1P substructure 30, described supra in conjunction with FIG. 1, FIG. 2, and FIG. 3, respectively.

Figure 13:
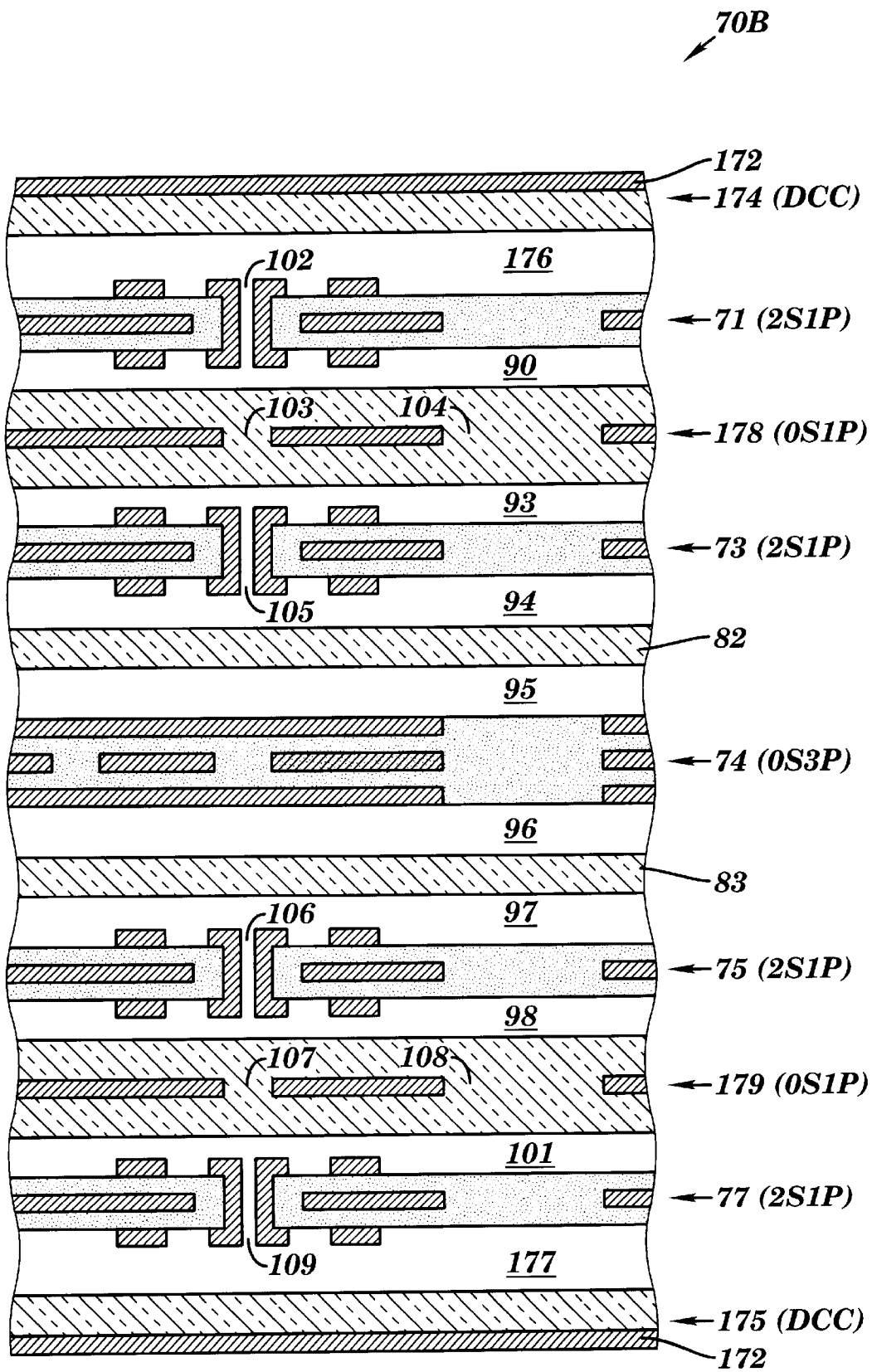
FIG. 13 depicts a multilayered laminate that includes DCC, alternative 0S1P, 0S3P, and 2S1P substructures, in accordance with preferred embodiments of the present invention.

FIG. 13 depicts a multilayered laminate that includes DCC, alternative 0S1P , 0S3P, and 2S1P substructures, in accordance with preferred embodiments of the present invention. In particular, the multilayered laminate 70B includes the following sequentially stacked arrangement of substructures and dielectric layers: a DCC substructure 174, a 2S1P substructure 71, a alternative 0S1P substructure 178, a 2S1P substructure 73, a dielectric layer 82, a 0S3P substructure 74, a dielectric layer 83, a 2S1P substructure 75, an alternative 0S1P substructure 179, a 2S1P substructure 77, and a DCC substructure 175. With the exception of the added DCC substructures 174 and 175, and substitution of the alternative 0S1P substructures 178 and 179 for the dielectric layers 80, 81, 84 and 85 and the 0S1P substructures 72 and 76 see FIG. 7) the multilayered laminate 70B is identical with the multilayered laminate 70 illustrated in FIG,. 7 and described supra. Use of the alternative 0S1P substructures 178 and 179 simplify the laminating processes by reducing the number of layers in the multilayered laminate 70B.

Although the aforementioned sequentially stacked substructures 174, 71, 178, 73–75, 179, 77 and 175 and dielectric layers 82 and 83, will be subsequently subjected to compressive stresses, they have not yet been subject to said compressive stresses. Accordingly, the sequentially stacked substructures 174, 71, 178, 73–75, 179, 77 and 175 and dielectric layers 82 and 83 have intervening void regions 176, 90, 93–98, 101 and 177 as follows. The void region 176 intervenes between the DCC substructure 174 and the 2S1P substructure 71. The void region 90 intervenes between the 2S1P substructure 71 the alternative 0S1P substructure 178. The void region 93 intervenes between the alternative 0S1P substructure 178. and the 2S1P substructure 73. The void region 94 intervenes between the 2S1P substructure 73 and the dielectric layer 82. The void region 95 intervenes between the dielectric layer 82 and the 0S3P substructure 74. The void region 96 intervenes between the 0S3P substructure 74 and the dielectric layer 83. The void region 97 intervenes between the dielectric layer 83 and the 2S1P substructure 75. The void region 98 intervenes between the 2S1P substructure 75 the alternative 0S1P substructure 179. The void region 101 intervenes between the alternative 0S1P substructure 179. and the 2S1P substructure 77. The void region 177 intervenes between the 2S1P substructure 77 and the DCC substructure 175. Note that void space al so exists in: a plated via 102 of the 2S1P substructure 71, holes 103 and 104 in the 0S1P substructure 72, a plated via 105 of the 2S1P substructure 73, a plated via 106 of the 2S1P substructure 75, holes 107 and 108 in the 0S1P substructure 76, and a plated via 109 of the 2S1P substructure 77.

The 0S1P substructures 72 and 76 of the multilayered laminate 70B in FIG. 13 have the same properties and features as were described supra in conjunction with FIG. 4 for the 0S1P substructure 40. The 0S3P substructure 74 of the multilayered laminate 70B in FIG. 13 has the same properties and features as were described supra in conjunction with FIG. 5 for the 0S3P substructure 50. The 2S1P substructures 71, 73, 75, and 77 of the multilayered laminate 70B in FIG. 13 have the same properties and features as were described supra in conjunction with FIG. 6 for the 2S1P substructure 60. The DCC substructures 174 and 175 of the multilayered laminate 70B in FIG. 13 have the same properties and features as were described supra in conjunction with FIG. 11 for the DCC substructure 170.

The particular arrangement of 0S1P, 0S3P, and 2S1P substructures in FIG. 13 is merely illustrative of the numerous possible arrangements. Generally, a multilayered laminate of the present invention may include any number and arrangements of 0S1P, 0S3P, and 2S1P substructures. Any or all of 0S1P, 0S3P, and 2S1P substructures may be present in the multilayered laminate. A multilayered laminate that comprises a 0S1P substructure and a 0S3P substructure, with no internal signal layers, may be useful in a power distribution system or in a structure with all circuitization on the external, exposed surfaces of the multilayered laminate. Note that a multilayered laminate may additionally include conventional substructures such as the 0S2P substructure 10, the 2S0P substructure 20, and the 1S1P substructure 30, described supra in conjunction with FIG. 1, FIG. 2, and FIG. 3, respectively.

Figure 14:
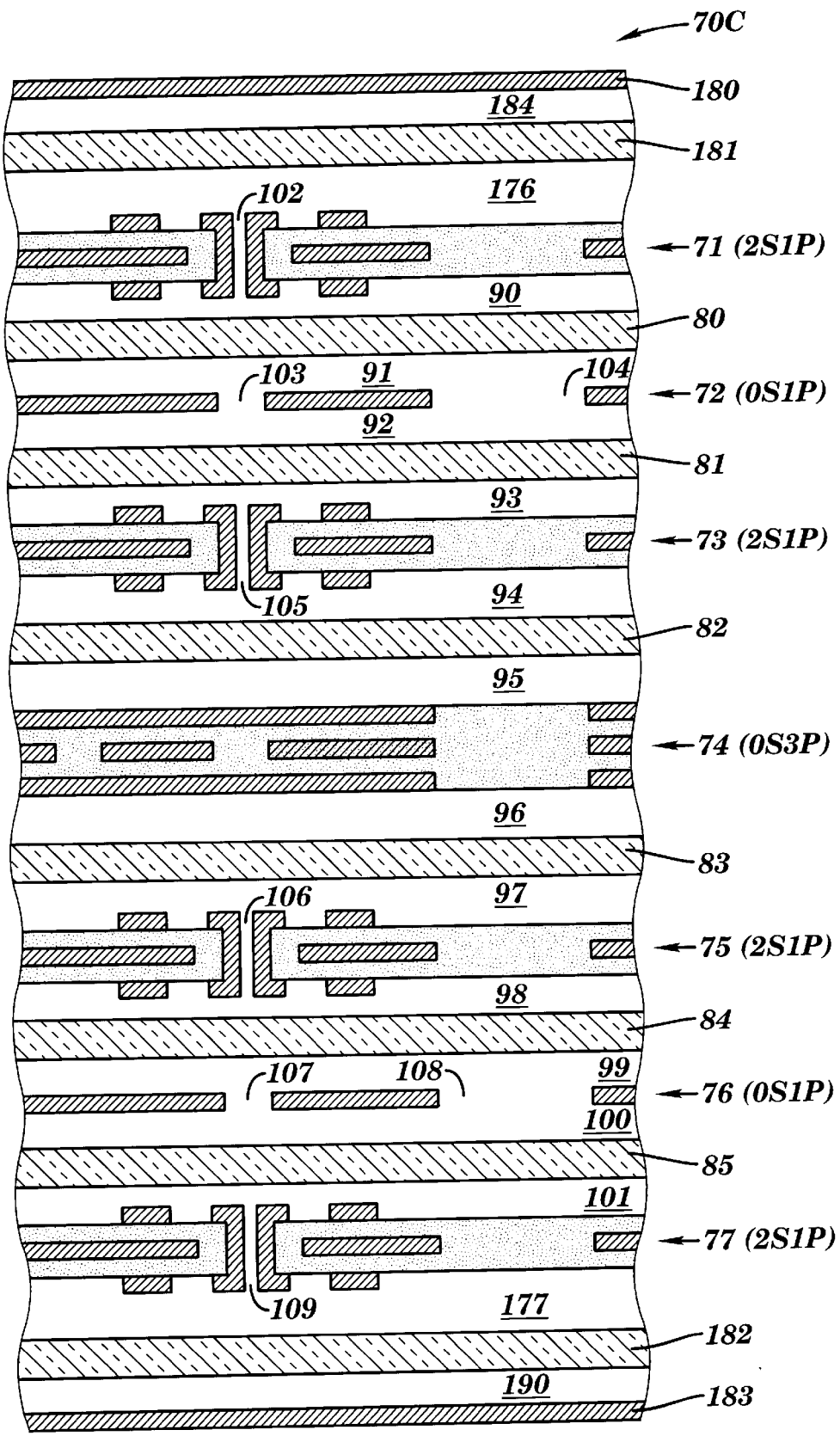
FIG. 14 depicts a multilayered laminate that includes upper and lower continuously conductive layers, 0S1P, 0S3P, and 2S1P substructures, in accordance with preferred embodiments of the present invention.

FIG. 14 depicts a multilayered laminate that includes upper and lower continuously conductive layers, 0S1P, 0S3P, and 2S1P substructures, in accordance with preferred embodiments of the present invention. In particular, the multilayered laminate 70C includes the following sequentially stacked arrangement of substructures and dielectric layers: an upper continuously conductive layer 180, a dielectric layer 181, a 2S1P substructure 71, a dielectric layer 80, a 0S1P substructure 72, a dielectric layer 81, a 2S1P substructure 73, a dielectric layer 82, a 0S3P substructure 74, a dielectric layer 83, a 2S1P substructure 75, a dielectric layer 84, a 0S1P substructure 76, a dielectric layer 85, a 2S1P substructure 77, a dielectric layer 182 and a lower continuously conductive layer 183. With the exception of the substitution of the upper and lower continuously conductive layers 180 and 183 and the dielectric layers 181 and 182 for the DCC substructures 174 and 175 the multilayered laminate 70C is identical, with the multilayered laminate 70A illustrated in FIG. 12 and described supra. The dielectric layers 180 and 181 may includes a PID material, a pure resin material, an epoxy material, a glass-reinforced dielectric, an allylated polyphenylene ether (APPE) resin or a silica filled polytetraflouroethylene (PTFE) resin such as Rogers 2800 made by the Rogers Corporation of Rogers, Conn.

Although the aforementioned sequentially stacked continuously conductive layers 180 and 183 substructures 71–77 and dielectric layers 181, 80–85, and 182 will be subsequently subjected to compressive stresses, they have not yet been subject to said compressive stresses. Accordingly, the sequentially stacked continuously conductive layers 180 and 183 substructures 71–77 and dielectric layers 181, 80–85, and 182 have intervening void regions 184, 176, 90–101, 177 and 190 as follows. The void region 184 intervenes between the upper continuously conductive layer 180 and the dielectric layer 181. The void region 176 intervenes between the dielectric layer 181 and the 2S1P substructure 71. The void region 90 intervenes between the 2S1P substructure 71 and the dielectric layer 80. The void region 91 intervenes between the dielectric layer 80 and the 0S1P substructure 72. The void region 92 intervenes between the 0S1P substructure 72 and the dielectric layer 81. The void region 93 intervenes between the dielectric layer 81 and the 2S1P substructure 73. The void region 94 intervenes between the 2S1P substructure 73 and the dielectric layer 82. The void region 95 intervenes between the dielectric layer 82 and the 0S3P substructure 74. The void region 96 intervenes between the 0S3P substructure 74 and the dielectric layer 83. The void region 97 intervenes between the dielectric layer 83 and the 2S1P substructure 75. The void region 98 intervenes between the 2S1P substructure 75 and the dielectric layer 84. The void region 99 intervenes between the dielectric layer 84 and the 0S1P substructure 76. The void region 100 intervenes between the 0S1P substructure 76 and the dielectric layer 85. The void region 101 intervenes between the dielectric layer 85 and the 2S1P substructure 77. The void region 177 intervenes between the 2S1P substructure 77 and the dielectric layer 182. The void region 190 intervenes between the 2S1P substructure 71 and the dielectric layer 183 and the lower continuously conductive layer 183. Note that void space also exists in: a plated via 102 of the 2S1P substructure 71, holes 103 and 104 in the 0S1P substructure 72, a plated via 105 of the 2S1P substructure 73, a plated via 106 of the 2S1P substructure 75, holes 107 and 108 in the 0S1P substructure 76, and a plated via 109 of the 2S1P substructure 77.

The 0S1P substructures 72 and 76 of the multilayered laminate 70C in FIG. 14 have the same properties and features as were described supra in conjunction with FIG. 4 for the 0S1P substructure 40. The 0S3P substructure 74 of the multilayered laminate 70C in FIG. 14 has the same properties and features as were described supra in conjunction with FIG. 5 for the 0S3P substructure 50. The 2S1P substructures 71, 73, 75, and 77 of the multilayered laminate 70C in FIG. 14 have the same properties and features as were described supra in conjunction with FIG. 6 for the 2S1P substructure 60. The upper and lower continuously conductive layers 180 and 183 and the dielectric layers 181 and 182 of the multilayered laminate 70C in FIG. 14 have the same properties and features as were described supra in conjunction with FIG. 11 for the DCC substructure 170.

The particular arrangement of 0S1P, 0S3P, and 2S1P substructures in FIG. 14 is merely illustrative of the numerous possible arrangements. Generally, a multilayered laminate of the present invention may include any number and arrangements of 0S1P, 0S3P, and 2S1P substructures. Any or all of 0S1P, 0S3P, and 2S1P substructures may be present in the multilayered laminate. A multilayered laminate that comprises a 0S1P substructure and a 0S3P substructure, with no internal signal layers, may be useful in a power distribution system or in a structure with all circuitization on the external, exposed surfaces of the multilayered laminate. Note that a multilayered laminate may additionally include conventional substructures such as the 0S2P substructure 10, the 2S0P substructure 20, and the 1S1P substructure 30, described supra in conjunction with FIG. 1, FIG. 2, and FIG. 3, respectively.

Figure 15:
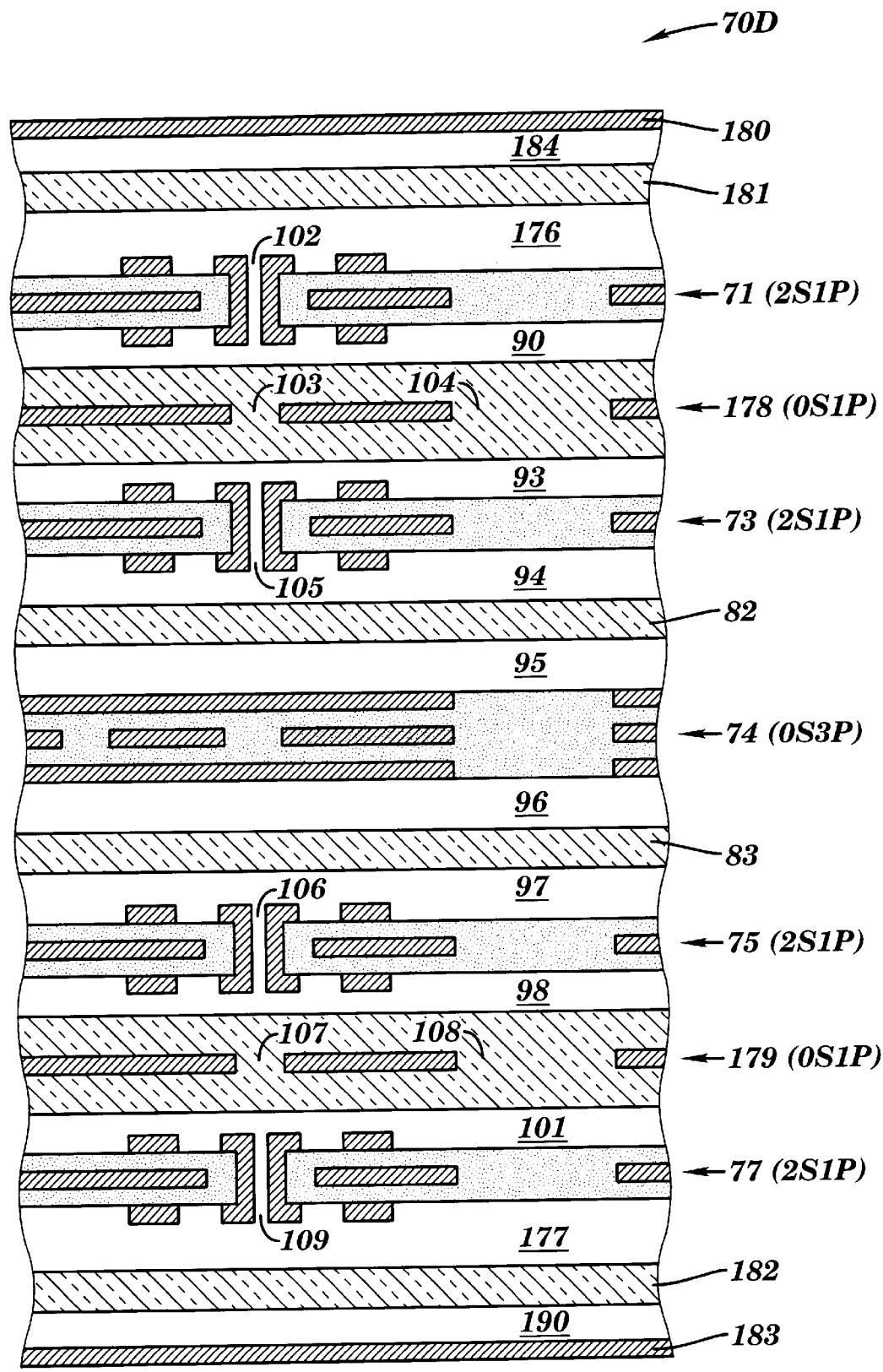
FIG. 15 depicts a multilayered laminate that includes upper and lower continuously conductive layers, alternative 0S1P, 0S3P, and 2S1P substructures, in accordance with preferred embodiments of the present invention.

FIG. 15 depicts a multilayered laminate that includes upper and lower continuously conductive layers, alternative 0S1P, 0S3P, and 2S1P substructures, in accordance with preferred embodiments of the present invention. In particular, the multilayered laminate 70D includes the following sequentially stacked arrangement of substructures and dielectric layers: an upper continuously conductive layer 180, a dielectric layer 181, a 2S1P substructure 71, a alternative 0S1P substructure 178, a 2S1P substructure 73, a dielectric layer 82, a 0S3P substructure 74, a dielectric layer 83, a 2S1P substructure 75, a alternative 0S1P substructure 179, a 2S1P substructure 77, a dielectric layer 182 and a lower continuously conductive layer 183 With the exception of the substitution of the upper and lower continuously conductive layers 180 and 183 and the dielectric layers 181 and 182 for the DCC substructures 174 and 175 the multilayered laminate 70D is identical with the multilayered laminate 70B illustrated in FIG. 13 and described supra. The dielectric layers 181 and 182 may include a PID material, a pure resin material, an epoxy material, a glass-reinforced dielectric, an allylated polyphenylene ether (APPE) resin or a silica filled polytetraflouroethylene (PTFE) resin such as Rogers 2800 made by the Rogers Corporation of Rogers, Conn.

Although the aforementioned sequentially stacked continuously conductive layers 180 and 183, substructures 71, 178, 73–75, 179 and 77 and dielectric layers 82, 83, 181 and 182 will be subsequently subjected to compressive stresses, they have not yet been subject to said compressive stresses. Accordingly, the sequentially stacked continuously conductive layers 180 and 183, substructures 71, 178, 73–75, 179 and 77 and dielectric layers 82, 83, 181 and 182 have intervening void regions 184, 176, 90, 93–98, 101, 177 and 190 as follows. The void region 184 intervenes between upper continuously conductive layer 180 and the dielectric layer 181. The void region 176 intervenes between the dielectric layer 181 and the 2S1P substructure 71. The void region 90 intervenes between the 2S1P substructure 71 the alternative 0S1P substructure 178. The void region 93 intervenes between the alternative 0S1P substructure 178. and the 2S1P substructure 73. The void region 94 intervenes between the 2S1P substructure 73 and the dielectric layer 82. The void region 95 intervenes between the dielectric layer 82 and the 0S3P substructure 74. The void region 96 intervenes between the 0S3P substructure 74 and the dielectric layer 83. The void region 97 intervenes between the dielectric layer 83 and the 2S1P substructure 75. The void region 98 intervenes between the 2S1P substructure 75 the alternative 0S1P substructure 179. The void region 101 intervenes between the alternative 0S1P substructure 179 and the 2S1P substructure 77. The void region 177 intervenes between the 2S1P substructure 77 and the dielectric layer 182. The void region 190 intervenes between the dielectric layer 182 and the lower continuously conductive layer 183. Note that void space also exists in: a plated via 102 of the 2S1P substructure 71, holes 103 and 104 in the 0S1P substructure 72, a plated via 105 of the 2S1P substructure 73, a plated via 106 of the 2S1P substructure 75, holes 107 and 108 in the 0S1P substructure 76, and a plated via 109 of the 2S1P substructure 77.

The 0S1P substructures 72 and 76 of the multilayered laminate 70D in FIG. 15 have the same properties and features as were described supra in conjunction with FIGS. 4 for the 0S1P substructure 40. The 0S3P substructure 74 of the multilayered laminate 70D in FIG. 15 has the same properties and features as were described supra in conjunction with FIG. 5 for the 0S3P substructure 50. The 2S1P substructures 71, 73, 75, and 77 of the multilayered laminate 70D in FIG. 15 have the same properties and features as were described supra in conjunction with FIG. 6 for the 2S1P substructure 60. The upper and lower continuously conductive layers 180 and 183 and the dielectric layers 181 and 182 of the multilayered laminate 70D in FIG. 15 have the same properties and features as were described supra in conjunction with FIG. 11 for the DCC substructure 170.

The particular arrangement of 0S1P, 0S3P, and 2S1P substructures in FIG. 15 is merely illustrative of the numerous possible arrangements. Generally, a multilayered laminate of the present invention may include any number and arrangements of 0S1P, 0S3P, and 2S1P substructures. Any or all of 0S1P, 0S3P, and 2S1P substructures may be present in the multilayered laminate. A multilayered laminate that comprises a 0S1P substructure and a 0S3P substructure, with no internal signal layers, may be useful in a power distribution system or in a structure with all circuitization on the external, exposed surfaces of the multilayered laminate. Note that a multilayered laminate may additionally include conventional substructures such as the 0S2P substructure 10, the 2S0P substructure 20, and the 1S1P substructure 30, described supra in conjunction with FIG. 1, FIG. 2, and FIG. 3, respectively.

Figure 16:
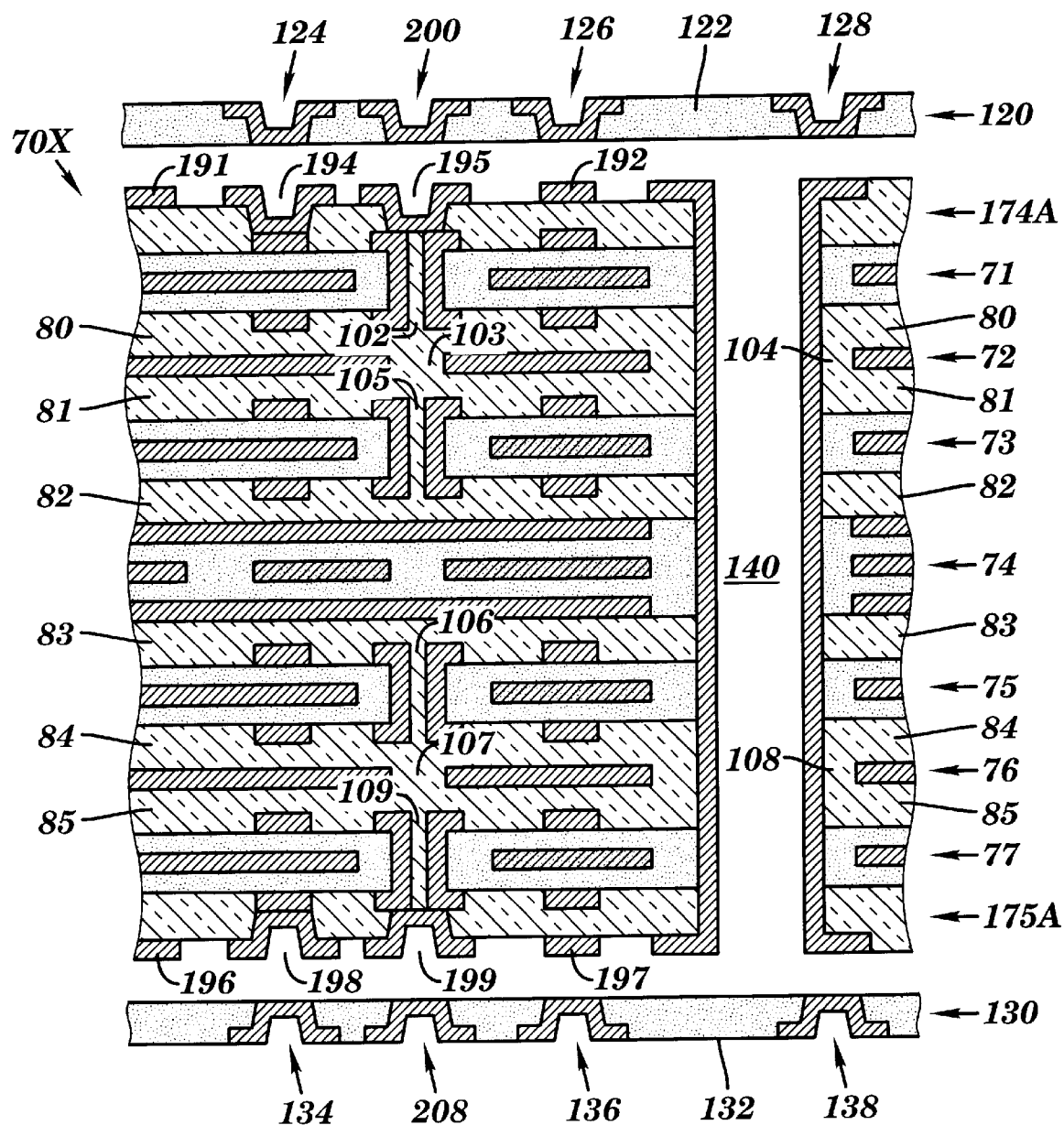
FIG. 16 depicts the multilayered laminate of FIG. 12, FIG. 13, FIG. 14 or FIG. 15 after being compressed.

FIG. 16 depicts the multilayered laminate of FIG. 12, FIG. 13, FIG. 14 or FIG. 15 after being compressed. FIG. 16 illustrates the multilayered laminate 70A of FIG. 12, 70B of FIG. 13, 70C of FIG. 14 or 70D of FIG, 15 after being compressed under an elevated temperature, such as by pressurization in a lamination press under a pressure preferably between about 100 psi and about 700 psi at a temperature preferably between about 180° C. and about 210°. Hereafter multilayered laminate 70X will be used to represent any of the multilayered laminates 70A of FIG. 12, 70B of FIG. 13, 70C of FIG. 14 or 70D of FIG. 15 in FIG. 16 even though the distinctions among FIGS. 12–15 are not explicitly shown. The compression and heating of the dielectric material of the dielectric layers causes the dielectric material to flow. The heating of the dielectric material of the dielectric layers cures said dielectric material.

The compression of the multilayered laminate 70X eliminates the void regions which were discussed supra in conjunction with FIGS. 12–15. As a result of the compression, the dielectric material of the dielectric layers fills out the prior void spaces between, and insulatively separates, each pair of successive substructures of the substructures. The dielectric material of the dielectric layers fill out the space in the plated vias and power planes After the multilayered laminate 70X has been compressed, a plated through hole (PTH) 140 may be formed through the multilayered laminate 70 (but may or may not yet be plated). The PTH 140 may be formed by any method known to one of ordinary skill in the art, such as mechanical or laser drilling.

Conductive lands 191 and 192 are formed and microvias 194 and 195 are formed in the DCC layer 174 (see FIGS. 12 and 13) or in the combination of the continuously conductive layer 180 and the dielectric layer 181 (see FIGS. 14 and 15), now laminated together, to form intermediate layer 174A. Likewise, conductive lands 196 and 197 and microvias 198 and 199 are formed in the DCC layer 175 (see FIGS. 12 and 13) or in the combination of the continuously conductive layer 183 and the dielectric layer 182 (see FIGS. 14 and 15), now laminated together, to form intermediate layer 175A. Microvias may be formed by any method known to one of ordinary skill in the art, such as mechanical or laser drilling. Part of the formation of the PTH 140 and the microvias 194, 195, 198, and 199 is a plating step. The PTH 140 land the microvias the microvias 194, 195, 198, and 199 may all be plated at the same with an electrically conductive material such as copper.

The microvias 194 and 195 may contact any portions of the substructure 71 and the microvias 198 and 199 may contact any portions of the substructure 77. Although FIG. 16 does not explicitly show the PTH 140 as being electrically (i.e., conductively) coupled to any of the substructures 174, 71–77 and 175 the PTH 140 and the substructures 174, 71–77 and 175 may be formed such that the PTH 140 conductively contacts some or all of the substructures 174, 71–77 and 175. Thus the PTH 140 may be used to provide electrical coupling among or between some or all of the substructures 174, 71–77 and 175. Additionally, the PTH 140 may be conductively coupled to electronic structures external to the multilayered laminate 70X (e.g., a chip) as will be discussed infra in conjunction with FIG. 17.

Figure 17:
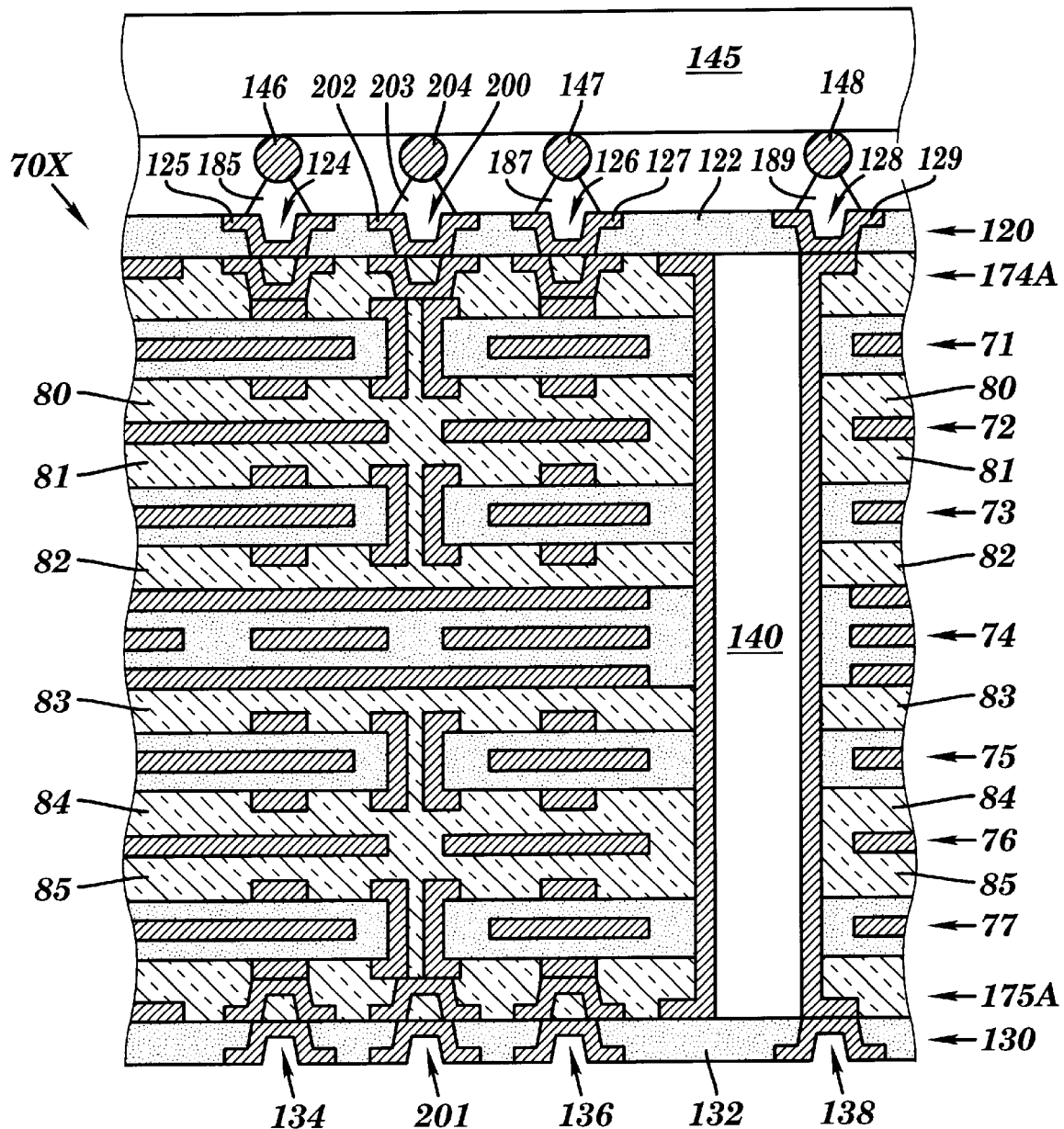
FIG. 17 depicts the multilayered laminate of FIG. 16 after surface layers have been applied to the multilayered laminate.

The surface layers 120 and 130, if present, may be applied to the multilayered laminate 70X as will be shown infra in conjunction with FIG. 17. The surface layer 120 includes a dielectric sheet 122, a microvia 124, a microvia 126, a microvia 128 and a microvia 200 such that the microvias 124, 126, 128 and 200 are within the dielectric sheet 122. The microvias 124, 126, 128 and 200 each have a plated layer of conductive material (e.g., copper). The surface layer 130 includes a dielectric sheet 132, a microvia 134, a microvia 136, a microvia 138 and a microvia 201, such that the microvias 134, 136, 138 and 201 are within the dielectric sheet 132. The microvias 134, 136, 138 and 201 each have a plated layer of conductive material (e.g., copper). The surface layers 120 and 130 may serve to effectuate electrically conductive coupling between the multilayered laminate 70X and external electronic structures. For example, the surface layer 120 may conductively couple a semiconductor chip to the multilayered laminate 70X by use of some or all of the microvias 124, 126, 128 and 200, as discussed infra in conjunction with FIG. 17. As another example, the surface layer 130 may conductively couple a solder ball of a ball grid array (BGA) to the multilayered laminate 70X by use of some or all of the microvias 134, 136, 138 and 201. The dielectric sheets 122 and 132 may include any dielectric material having structural and insulative properties that support said conductive coupling between the multilayered laminate 70X and the external electronic structures. The dielectric material within the dielectric sheets 122 and 132 preferably includes a resin comprising an allylated polyphenylene ether (APPE). A particularly useful APPE is an APPE resin coated on a copper foil, made by the Asahi Chemical Company of Japan and identified as Asahi product number PC5103. Alternatively, the dielectric material within the dielectric sheets 122 and 132 may include a photoimageable dielectric or a resin-coated copper foil. Although the surface layers 120 and 130 are each shown in FIG. 8 to include three microvias, the surface layers 120 and 130 may each include any number of microvias, or no microvia. The number of microvias included within the surface layer 120 may be unrelated to the number of microvias included within the surface layer 130. In addition to having microvias, the surface layers 120 and 130 may each include surface circuitization lines.

FIG. 17 depicts the multilayered laminate of FIG. 16 after surface layers have been applied to the multilayered laminate. In FIG. 17 the surface layers 120 and 130 have been applied to the multilayered laminate 70X by any method that is compatible with the particular dielectric material used in the dielectric sheet 122 and 132, respectively. For example, the surface layers 120 and 130, if including the allylated polyphenylene ether (APPE) that is initially coated on a copper foil such as the Asahi resin PC5103 (discussed supra), may be applied to the multilayered laminate 70X by pressurization in a range of about 1000 psi to about 2000 psi at an elevated temperature between about 180° C. and about 210° C. for a time of at least about 90 minutes. The pressurization and elevated temperatures causes the APPE resin to flow and become cured, resulting in application of the surface layers 120 and 130 to the multilayered laminate 70. After the pressurization, the copper foils may be left intact, or removed in any manner known to one of ordinary skill in the art, such as by etching.

The microvias 124, 126, 128 and 200 are formed in the surface layer 120 after the surface layer 120 has been applied to the multilayered laminate 70X. Similarly, the microvias 134, 136, 138 and 201 are formed in the surface layer 130 after the surface layer 130 has been applied to the multilayered laminate 70X. The microvias 124, 126, 128 and 200, as well as the microvias 134, 136, 138 and 201, may be formed by any method known to one of ordinary skill in the art, such as by laser drilling into the dielectric sheet 122 down to the conductive metalization on the signal layer 120 to form a microvia, followed by electroless plating of metal (e.g., copper) on seeded surfaces (e.g., palladium seeded surfaces) of the microvia to form an electroless layer of the metal. After the electroless plating, the metal (e.g., copper) is electroplated over the electroless layer to form the plated layer of each of microvias 124, 126, 128, 134, 136, 138, 200 and 201.

In FIG. 17, an electrical device 145 (e.g., a semiconductor chip) has been coupled to the multilayered laminate 70X by solder contact members 146, 147, 148 and 204. The solder contact members 146, 147, 148 and 204 are conductively coupled to the solder interfaces 185, 187, 189 and 203 within the microvias 124, 126, 128 and 200, respectively. The plated layers 125, 127, 129 and 202 of the microvias 124, 126, 128 and 200, respectively, are conductively coupled to the multilayered laminate 70X at the intermediate layer 174A. Note, the plated through hole 140 is conductively coupled to the intermediate layer 174A (and intermediate layer 175A) and not directly to either of the surface layers 120 or 130 as was illustrated in FIG. 9 and discussed supra. The solder contact members 146, 147, 148 and 204 may each include, inter alia, a Controlled Collapse Chip Connection (C4) solder ball. If the surface layer 120 is not present, then the electrical device 145 may be conductively coupled directly to the multilayered laminate 70X at the intermediate layer 174A.

The use of the intermediate layers 174A and 175A requires shorter PTH drilling, allows replacement of some of the PTHs 140 with combinations of shorter though holes and microvias thereby freeing up for wiring, within laminate 70X, space previously occupied by some of the PTHs 140. The PTHs 140 may also be placed in less dense portions of laminate 70X While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming a multilayered laminate, comprising:

stacking a plurality of signal/power plane substructures to form a stack of signal/power plane substructures, wherein a subset of the plurality of signal/power plane substructures is selected from the group consisting of an 0S3P substructure, and an 0S1P substructure and a 0S3P substructure, and wherein a dielectric material of an intervening dielectric layer insulatively separates each pair of successive signal/power plane substructures;

positioning a first continuously conductive layer on a first dielectric layer, said first dielectric layer stacked on a first side of said stack of signal/power plane substructures;

positioning a second continuously conductive layer on a second dielectric layer, said second dielectric layer stacked on a second side of said stack of signal/power plane substructures; and applying heat and/or pressure to the resultant stack of signal/power plane substructures and said first and second dielectric layers and said first and second continuously conductive layers to form said multilayered laminate.

2. A method for forming a multilayered laminate, comprising:

stacking a plurality of signal/power plane substructures to form a stack of signal/power plane substructures, wherein a subset of the plurality of signal/power plane substructures is selected from the group consisting of an 0S1P substructure and a 2S1P substructure, an 0S3P substructure and said 2S1P substructure, and said 0S1P substructure and said 0S3P substructure and said 2S1P substructure, and wherein a dielectric material of an intervening dielectric layer insulatively separates each pair of successive signal/power plane substructures;

positioning a first continuously conductive layer on a first dielectric layer, said first dielectric layer stacked on a first side of said stack of signal/power plane substructures;

positioning a second continuously conductive layer on a second dielectric layer, said second dielectric layer stacked on a second side of said stack of signal/power plane substructures; and applying heat and/or pressure to the resultant stack of signal/power plane substructures and said first and second dielectric layers and said first and second continuously conductive layers to form said multilayered laminate.

3. The method of claim 2, wherein said plurality of signal/power planes includes at least one 0S1P substructure and wherein intervening dielectric layers immediately adjacent to opposite sides of each 0S1P substructure are laminated to each 0S1P substructure prior to stacking said stack of signal/power planes substructures.

4. The method of claim 2, wherein said first dielectric layer is applied to said first continuously conductive layer and said second dielectric layer is applied to said second continuously conductive layer prior to stacking said stack of signal/power planes substructures.

5. The method of claim 2, further comprising forming one or more plated through holes through said multilayered laminate.

6. The method of claim 2, further comprising:

forming microvias and conductive lands in said first continuously conductive layer and said first dielectric layer to form a first intermediate layer; and forming microvias and conductive lands in said second continuously conductive layer and said second dielectric layer to form a second intermediate layer.

7. The method of claim 8, further comprising:

forming one or more plated through holes through said multilayered laminate;

laminating a first surface layer to said first intermediate layer; and forming microvias in said first surface layer, at least some of said microvias formed in said first surface layer conductively coupled to microvias and conductive lands of said first intermediate layer and to said plated through holes.

8. The method of claim 7, further comprising:

laminating a second surface layer to said second intermediate layer; and forming microvias in said second surface layer, at least some of said microvias formed in said second surface layer conductively coupled to microvias and conductive lands of said second intermediate layer and to said plated through holes.

9. The method of claim 2, wherein said first and second dielectric layers and said intervening dielectric layers include material selected from the group consisting of a photoimageable dielectric material, a pure resin material, an epoxy material, a glass-reinforced dielectric, an allylated polyphenylene ether resin and a silica filled polytetraflouroethylene resin and wherein said first and second continuously conductive layers include material selected from the group consisting of copper, a copper alloy, or a copper-Invar-copper sandwich.

10. An electrical structure comprising:
a multilayered laminate that includes in sequential order:
(a) a first intermediate layer having microvias and conductive lands;
(b) a plurality of signal/power plane substructures, wherein a subset of the plurality of signal/power plane substructures is selected from the group consisting of an 0S3P substructure, and an 0S1P substructure and a 0S3P substructure, and wherein a dielectric material of an intervening dielectric layer insulatively separates each pair of successive signal/power plane substructures; and
(c) a second intermediate layer having microvias and conductive lands.

11. An electrical structure comprising:
a multilayered laminate that includes in sequential order:
(a) a first intermediate layer having microvias and conductive lands;
(b) a plurality of signal/power plane substructures, wherein a subset of the plurality of signal/power plane substructures is selected from the group consisting of an 0S1P substructure and a 2S1P substructure, an 0S3P substructure and said 2S1P substructure, and said 0S1P substructure and said 0S3P substructure and said 2S1P substructure, and wherein a dielectric material of an intervening dielectric layer insulatively separates each pair of successive signal/power plane substructures; and
(c) a second intermediate layer having microvias and conductive lands.

12. The electrical structure of claim 11, further comprising one or more plated through holes through said multilayered laminate.

13. The electrical structure of claim 11, further comprising a first surface layer having microvias conductively coupled to said first intermediate layer, at least some of said microvias of said first surface layer conductively coupled to said microvias and said conductive lands of said first intermediate layer and to said plated through holes.

14. The electrical structure of claim 13, further comprising a second surface layer having microvias conductively coupled to said second intermediate layer, at least some of said microvias of said second surface layer conductively coupled to microvias and conductive lands of said second intermediate layer and to said plated through holes.

15. The electrical structure of claim 13, wherein an electronic device is conductively coupled to said first surface layer.

16. The electrical structure of claim 11 wherein at least some of said microvias of said first and second intermediate layer are conductively coupled to plated vias and signal planes of a substructure selected from the group of substructures consisting of 01SP, 0S3P and 2S1P substructures.

17. The electrical structure of claim 11, wherein said intervening dielectric layers include material selected from the group consisting of a photoimageable dielectric material, a pure resin material, an epoxy material, a glass-reinforced dielectric, an allylated polyphenylene ether resin and a silica filled polytetraflouroethylene resin and wherein said first and second continuously conductive layers include material selected from the group consisting of copper, a copper alloy, or a copper-Invar-copper sandwich.

* * * * *